US008584055B2

(12) United States Patent
Gyoda et al.

(10) Patent No.: US 8,584,055 B2
(45) Date of Patent: Nov. 12, 2013

(54) NON-TRANSITORY COMPUTER-READABLE STORAGE MEDIUM, DECISION METHOD AND COMPUTER FOR DECIDING EXPOSURE CONDITION USING EVALUATION ITEM OF INTEREST AND AUXILIARY EVALUATION ITEM

(75) Inventors: Yuichi Gyoda, Utsunomiya (JP); Kouichirou Tsujita, Utsunomiya (JP)

(73) Assignee: Canon Kabushiki Kaisha (JP)

(*) Notice: Subject to any disclaimer, the term of this patent is extended or adjusted under 35 U.S.C. 154(b) by 0 days.

(21) Appl. No.: 13/409,466

(22) Filed: Mar. 1, 2012

(65) Prior Publication Data
US 2012/0233574 A1 Sep. 13, 2012

(30) Foreign Application Priority Data
Mar. 10, 2011 (JP) .................................. 2011-053556

(51) Int. Cl.
*G06F 17/50* (2006.01)
(52) U.S. Cl.
USPC .......................................................... 716/51
(58) Field of Classification Search
USPC ............ 716/51; 430/5, 322; 382/144; 702/81
See application file for complete search history.

(56) References Cited

U.S. PATENT DOCUMENTS

2007/0219736 A1* 9/2007 Okita .............................. 702/81
2008/0158529 A1 7/2008 Hansen

FOREIGN PATENT DOCUMENTS

JP 2008166777 A 7/2008

OTHER PUBLICATIONS

Matsuyama, Tomoyuki et al., "A Study of Source & Mask Optimization for ArF Scanners", Proc. of SPIE vol. 7274.
Pang, Linyong et al., "Optimization from Design Rules, Source and Mask, to Full Chip with a Single Computational Lithograpy Framework: Level-Set-Methods-based Inverse Lithography Technology (ILT)", Proc. of SPIE vol. 7640.

* cited by examiner

*Primary Examiner* — Vuthe Siek
(74) *Attorney, Agent, or Firm* — Rossi, Kimms & McDowell LLP

(57) ABSTRACT

The present invention provides a non-transitory computer-readable storage medium storing a program that causes a computer to decide an exposure condition in an exposure apparatus, the program causing the computer to execute a step of selecting an evaluation item of interest from a plurality of evaluation items to be used to evaluate an image formed on an image plane of a projection optical system in correspondence with the exposure condition, a step of selecting, as an auxiliary evaluation item, an evaluation item which is different from the evaluation item of interest and changes a value in the same direction as that of a change in a value of the evaluation item of interest upon changing parameter values included in the exposure condition, and a step of setting an evaluation function including the evaluation item of interest and the auxiliary evaluation item as values.

18 Claims, 19 Drawing Sheets

F I G. 18
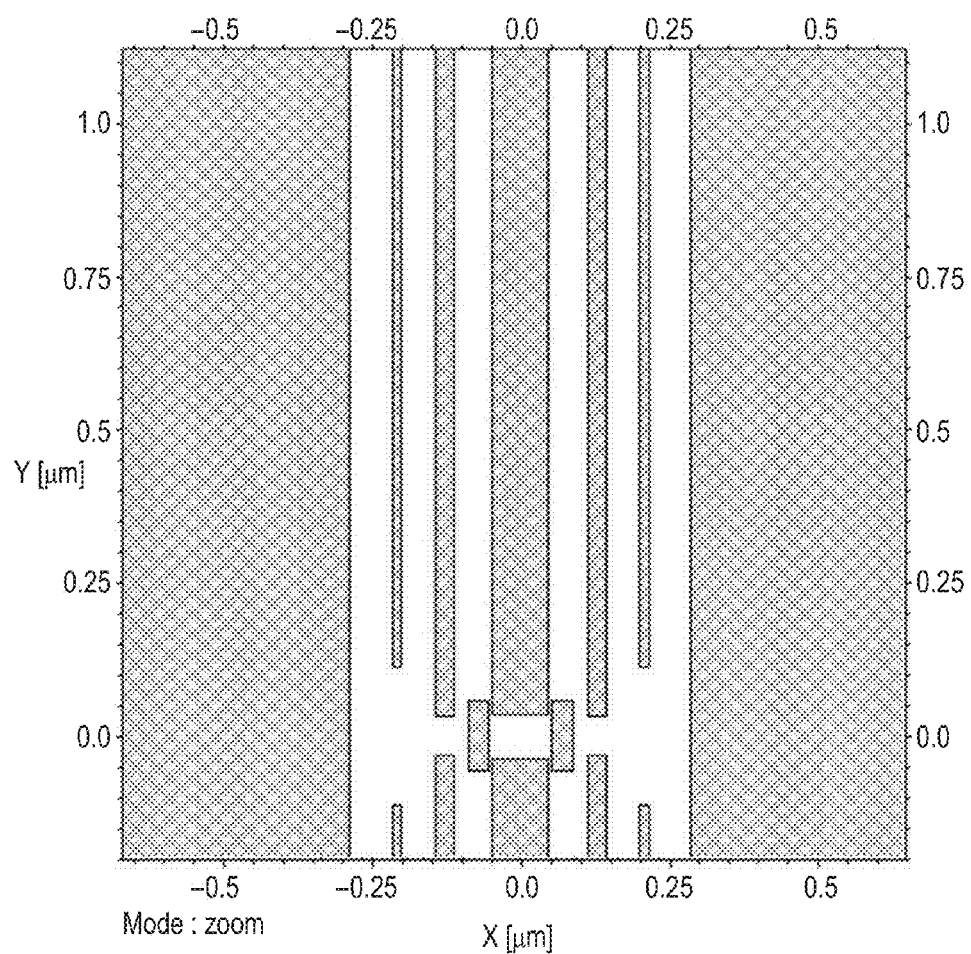

NON-TRANSITORY COMPUTER-READABLE STORAGE MEDIUM, DECISION METHOD AND COMPUTER FOR DECIDING EXPOSURE CONDITION USING EVALUATION ITEM OF INTEREST AND AUXILIARY EVALUATION ITEM

BACKGROUND OF THE INVENTION

1. Field of the Invention

The present invention relates to a non-transitory computer-readable storage medium storing a program for deciding an exposure condition in an exposure apparatus, a decision method, and a computer.

2. Description of the Related Art

In an exposure step using an exposure apparatus, it is generally required to transfer, based on desired image characteristics, a photoresist (resist) applied to the surface of a substrate such as a wafer and hardly change the image characteristics in case of variations (errors) in the focal point, exposure amount, and the like. Techniques of optimizing (deciding) an exposure condition in an exposure apparatus have been proposed in Japanese Patent Laid-Open No. 2008-166777, T. Matsuyama, et. al., "A Study of Source & Mask Optimization for ArF Scanners", Proc. of SPIE, USA, SPIE, 2009, Vol. 7274, p. 727408 (literature 1), and Linyong Pang, et. al., "Optimization from Design Rules, Source and Mask, to Full Chip with a Single Computational Lithography Framework: Level-Set-Methods-based Inverse Lithography Technology (ILT)", Proc. of SPIE, USA, SPIE, 2010, Vol. 7640, 764000 (literature 2). The image characteristics include, for example, the size and shape of an image, the contrast, the margin of the image size for the exposure amount, and the margin of the image size for the focal point. The exposure conditions include the shape of an effective light source (the light intensity distribution formed on the pupil plane of the illumination optical system), the numerical aperture (NA) and aberration of the projection optical system, the pattern (size and shape) of a mask arranged on the object plane of the projection optical system, and the transmittance of the mask.

When optimizing an exposure condition, a condition that maximizes the target of interest of the user, for example, the depth of focus (DOF) for the line width of a specific image is searched for concerning the effective light source or the mask pattern. Note that the exposure condition optimization is not limited to searching for the exposure condition that increases the DOF. For example, if the aberration of the projection optical system of the exposure apparatus always varies, searching for an exposure condition that suppresses the influence of such aberration variation is desired. For an exposure apparatus in which the fluctuation of the exposure amount is small, searching for an exposure condition to obtain not the margin of the exposure amount but the depth of focus (margin for the focal point) is desired. If the stage of an exposure apparatus largely vibrates, searching for an exposure condition with which the image characteristics hardly change for the stage vibration is desired. That is, there exist wider needs for exposure condition optimization, and various kinds of exposure conditions are optimized.

In the exposure condition optimization, generally, an evaluation item (for example, DOF, NILS, or line width) is set in advance, and an exposure condition is optimized such that the value of the evaluation item (evaluation amount) satisfies the standard. For an evaluation item such as the DOF or NILS (Normalized Image Log Slope) whose evaluation amount is preferably as large as possible, optimizing the exposure condition means maximizing the evaluation amount. On the other hand, for an evaluation item such as a line width error whose evaluation amount is preferably as small as possible, optimizing the exposure condition means minimizing the evaluation amount. More specifically, the exposure condition optimization is executed by obtaining an evaluation amount under a given exposure condition (parameters that define the shape of the effective light source or the shape of the mask pattern) and changing the exposure condition in accordance with the evaluation amount (repetitively changing the exposure condition). The exposure condition changing method depends on a mathematical method or algorithm, and various methods have been proposed. An evaluation item (evaluation amount) of interest will be referred to as an optimization cost hereinafter. Note that the optimization cost is sometimes called a merit function or a metric, or simply as a cost or a merit.

In the related art, an evaluation item of interest is directly set as an optimization cost. For example, in Japanese Patent Laid-Open No. 2008-166777, the line width (CD) uniformity or the like is set as the optimization cost, and the optimum effective light source shape is obtained. In literature 1, a common process window or OPE characteristic (line width) is set as the optimization cost, and the optimum effective light source shape or mask pattern is obtained. In literature 2, an edge placement error is set as the optimization cost, and the exposure condition is optimized.

However, the present inventor has found that in the related art, the exposure condition cannot be optimized in some cases because the evaluation item of interest is directly set as the optimization cost.

In the related art, as described above, the optimization cost value is obtained while changing an exposure condition, and the direction in which the exposure condition is changed is decided based on the change in the optimization cost value, thereby making the exposure condition gradually converge to an optimum condition. Hence, it is important that the optimization cost value changes every time the exposure condition changes.

For example, examine optimization of the exposure condition to maximize the DOF. In the related art, the DOF is directly set as the optimization cost, and the exposure condition is changed to maximize the optimization cost. Assume that the value of the DOF becomes large when the exposure condition is changed. This suggests that the value of the DOF can be made larger at a high probability by changing the exposure condition in the direction in which it has been changed. Alternatively, assume that the value of the DOF becomes small when the exposure condition is changed. This suggests that the value of the DOF can be made larger at a high probability by changing the exposure condition in a direction reverse to the direction in which it has been changed.

If the value of the DOF does not change even when the exposure condition is changed, the direction in which the exposure condition should be changed cannot be known. More specifically, even when the effective light source shape or the mask pattern is changed, the value of the DOF is hardly obtained (that is, the DOF continuously takes a value of 0) in some cases. When the optimization cost continuously takes a specific value, the direction in which the exposure condition is to be changed cannot be known. Hence, the exposure condition cannot be optimized.

To avoid this problem, the range of exposure condition change (search) may be narrowed. In this case, however, the exposure condition can be searched for in a very narrow range and optimized in the limited narrow range. This is not practical because the exposure condition cannot globally be optimized. As described above, the exposure condition cannot be optimized sometimes. However, the related art has mentioned neither the problem nor the solution to it, as a matter of course.

SUMMARY OF THE INVENTION

The present invention provides a technique advantageous in deciding an exposure condition in an exposure apparatus.

According to one aspect of the present invention, there is provided a non-transitory computer-readable storage medium storing a program that causes a computer to decide an exposure condition in an exposure apparatus including an illumination optical system for illuminating a mask, and a projection optical system for projecting an image of a pattern of the mask onto a substrate, the program causing the computer to execute a first step of selecting an evaluation item of interest that is an evaluation item on which focus is to be placed from a plurality of evaluation items to be used to evaluate an image formed on an image plane of the projection optical system in correspondence with the exposure condition in comparison with a target pattern to be formed on the substrate, a second step of selecting, as an auxiliary evaluation item, an evaluation item from the plurality of evaluation items which is different from the evaluation item of interest and changes a value in the same direction as that of a change in a value of the evaluation item of interest upon changing parameter values included in the exposure condition, a third step of setting an evaluation function including the evaluation item of interest and the auxiliary evaluation item as values, a fourth step of changing the parameter values so as to make a value of the evaluation function closer to a target value and calculating the value of the evaluation function for each of a plurality of images formed on the image plane of the projection optical system in correspondence with the parameter values, and a fifth step of deciding, as the parameter values included in the exposure condition, parameter values corresponding to a value of the evaluation function satisfying the target value out of the plurality of values of the evaluation function calculated in the fourth step.

Further aspects of the present invention will become apparent from the following description of exemplary embodiments with reference to the attached drawings.

BRIEF DESCRIPTION OF THE DRAWINGS

FIG. 18 is a view showing an example of the mask pattern.

DESCRIPTION OF THE EMBODIMENTS

Figure 1:
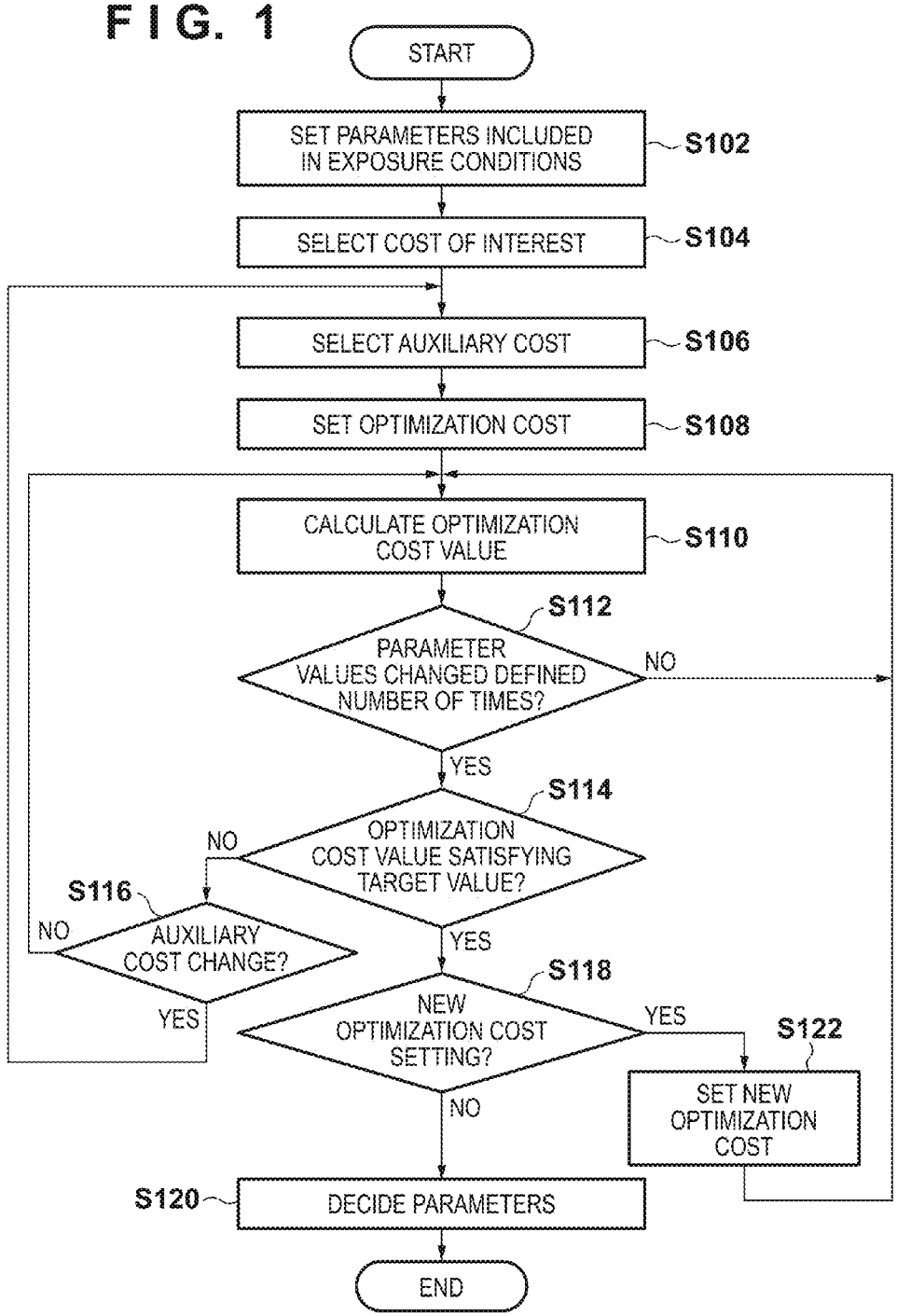
FIG. 1 is a flowchart for explaining a decision method according to an aspect of the present invention.

Preferred embodiments of the present invention will be described below with reference to the accompanying drawings. Note that the same reference numerals denote the same members throughout the drawings, and a repetitive description thereof will not be given.

The present invention is applicable to decide an exposure condition in an exposure apparatus to be used for the micromechanics or the manufacture of various devices including a semiconductor chip such as an IC or an LSI, a display device such as a liquid crystal panel, a detection device such as a magnetic head, and an image sensor such as a CCD. The micromechanics indicates a technique of creating a micron-basis mechanical system having an advanced function by applying the semiconductor integrated circuit manufacturing technology to the manufacture of a microstructure, or the mechanical system itself.

First Embodiment

FIG. 1 is a flowchart for explaining a decision method according to an aspect of the present invention. The decision method according to this embodiment is executed by an information processing apparatus such as a computer and decides (optimizes) an exposure condition in an exposure apparatus including an illumination optical system for illuminating a mask (reticle) and a projection optical system for projecting the pattern of the mask onto a substrate. The exposure condition is a condition settable in the exposure apparatus. In this embodiment, the exposure conditions include at least one of the shape of the pattern of the mask (mask pattern) and the light intensity distribution (effective light source shape) to be formed on the pupil plane of the illumination optical system.

In step S102, parameters included in exposure conditions are set. In this embodiment, parameters that define exposure conditions to be optimized, for example, the effective light source shape or the mask pattern shape are set. However, the parameters included in exposure conditions need only be physical quantities associated with the exposure conditions.

For example, the NA of the projection optical system or an amount derived from the magnitude of the aberration of the projection optical system may set as a parameter.

Figure 2:
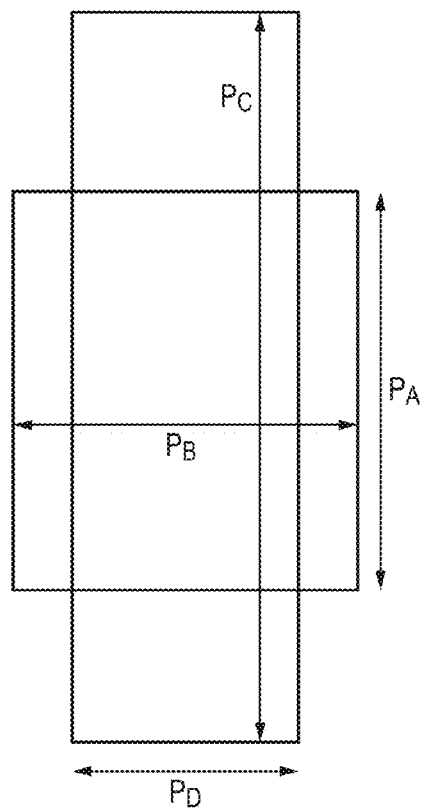
FIG. 2 is a view showing an example of parameters that define a mask pattern shape set in step S102 of FIG. 1.
Figure 4:
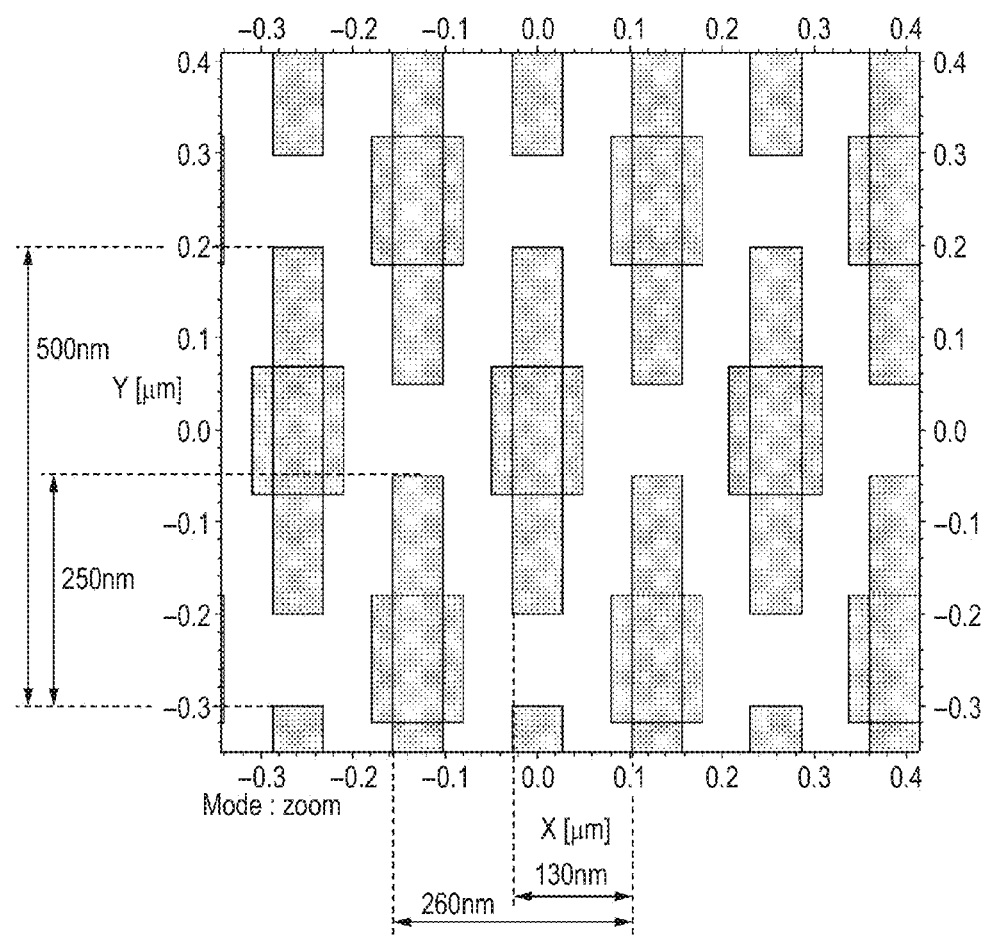
FIG. 4 is a view showing an example of the mask pattern.

In this embodiment, concerning the mask pattern, parameters $P_A$, $P_B$, $P_C$, and $P_D$ that define the shape of the pattern (mask pattern) for an SRAM memory cell are set, as shown in FIG. 2. The pattern shown in FIG. 2 is formed from two rectangles, and the parameters $P_A$, $P_B$, $P_C$, and $P_D$ represent the lengths of the sides of the two rectangles. Note that when calculating the image (optical image) of the mask pattern to be formed on the image plane of the projection optical system, the pattern shown in FIG. 2 is periodically infinitely arranged and used as the mask pattern. More specifically, a basic pattern group including two patterns shown in FIG. 2 is set, in which the patterns are separated by 130 nm in the X-axis direction and 250 nm in the Y-axis direction. The basic pattern group is arranged at a period of 260 nm in the X-axis direction and a period of 500 nm in the Y-axis direction, as shown in FIG. 4, thereby forming a mask pattern.

In this embodiment, the lengths of the sides of the rectangles included in the mask pattern are set as the parameters. Instead, coordinates associated with the sides such as the coordinates of the positions of the vertices or the positions of the middle points of the respective sides may be set as the parameters that define the mask pattern shape. The transmittance or phase of the mask can also be set as a parameter.

Figure 3:
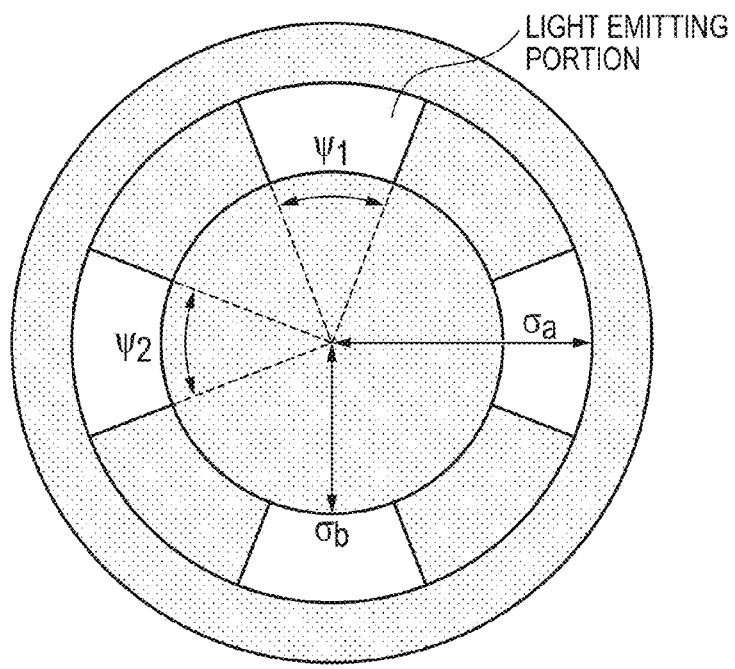
FIG. 3 is a view showing an example of parameters that define an effective light source shape set in step S102 of FIG. 1.

Concerning the effective light source, parameters $\Psi_1$, $\Psi_2$, $\sigma_a$, and $\sigma_b$ that define the shape of asymmetric quadrupole illumination are set, as shown in FIG. 3. The parameter $\Psi_1$ represents the angle of a light emitting portion located in the vertical direction of the asymmetric quadrupole illumination, and the parameter $\Psi_2$ represents the angle of a light emitting portion located in the horizontal direction of the asymmetric quadrupole illumination. In addition, the parameter $\sigma_a$ represents the outer sigma value, and the parameter $\sigma_b$ represents the inner sigma value. Note that when the value of the parameter $\Psi_1$ equals that of the parameter $\Psi_2$, the angle of the light emitting portion located in the vertical direction equals that of the light emitting portion located in the horizontal direction. Hence, the asymmetric quadrupole illumination of this embodiment includes symmetric quadrupole illumination (simply called quadrupole illumination, in this case). The asymmetric quadrupole illumination is sometimes called I-Quad illumination.

In this embodiment, the parameters are set for asymmetric quadrupole illumination. Instead, the parameters (for example, the outer sigma value and the inner sigma value) may be set for annular illumination or illumination with another shape.

As described above, in this embodiment, the eight parameters $P_A$, $P_B$, $P_C$, $P_D$, $\Psi_1$, $\Psi_2$, $\sigma_a$, and $\sigma_b$ that define the mask pattern shape and the effective light source shape are set in step S102. Note that as for the other exposure conditions, the NA of the projection optical system is set (fixed) to 0.93, the wavelength of exposure light to 193 nm, and the polarization state of the exposure light to tangential polarization in this embodiment.

In step S104, an evaluation item of interest (cost of interest) that is the evaluation item on which focus is to be placed is selected from a plurality of evaluation items to be used to evaluate an optical image formed on the image plane of the projection optical system in correspondence with the exposure conditions in comparison with a target pattern to be formed on the substrate.

Figure 5:
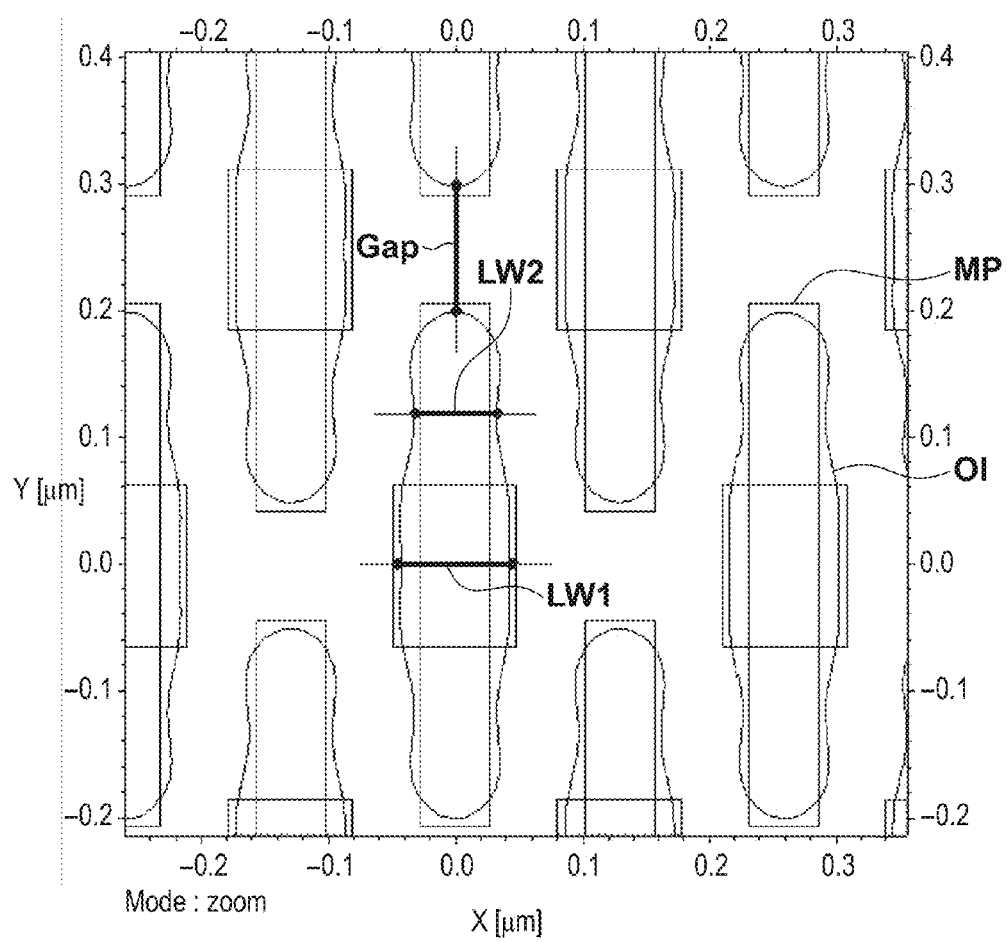
FIG. 5 is a view showing an example of the mask pattern and an optical image formed on the image plane of the projection optical system.

The cost of interest set in this embodiment will be described in detail. FIG. 5 is a view showing an example of an optical image formed on the image plane of the projection optical system when the effective light source (asymmetric quadrupole illumination) shown in FIG. 3 illuminates the mask pattern shown in FIG. 4. Referring to FIG. 5, MP represents a mask pattern and OI represents an optical image. In the optical image OI, the target values of line widths LW1 and LW2 and an interval Gap in the Y-axis direction (vertical direction) are set to 90 nm, 65 nm, and 100 nm, respectively. In this embodiment, the focal point range where the shift amount from the target value is 10% or less for each of the line widths LW1 and LW2 and the interval Gap will be referred to as a common line width DOF. The common line width D0F is selected as the cost of interest. The larger the value of the common line width DOF is, the more hardly the line widths of the formed optical image change for the shift of the focal point of the projection optical system. As described above, since the value of the common line width DOF is preferably as large as possible, optimizing the optimization cost to be described later means maximizing the optimization cost.

The optical image of this embodiment can be either an image (referred to as a simple optical image, an aerial image, or simply as an optical image) obtained by simply calculating the intensity of light that reaches each position of the image plane of the projection optical system or another optical image. For example, to obtain an image corresponding to a resist image, a Gaussian function representing diffusion of the acid of the resist is convolved in an optical image, or a resist model expressed by a specific equation is taken into consideration in some cases. Such an optical image is also included in the optical image of this embodiment. An optical image considering a resist model can be calculated using a commercially available optical simulator such as Prolith®.

In this embodiment, the common line width DOF (that is, the depth of focus on the image plane of the projection optical system) is selected as the cost of interest. However, the cost of interest is not limited to this. An evaluation item that changes its value in accordance with the change in an exposure condition suffices. For example, the exposure margin, NILS, or the sensitivity of a line width to MSD (Moving Standard Deviation) that means the vibration of the mask stage or wafer stage of the exposure apparatus may be selected as the cost of interest.

In step S106, an auxiliary cost (auxiliary evaluation item) is selected. The difference between the cost of interest and the auxiliary cost is as follows. The cost of interest is the evaluation item itself on which focus is placed (that is, to be optimized). The auxiliary cost is an auxiliary evaluation item to be used to appropriately optimize the cost of interest. More specifically, the auxiliary cost is an evaluation item that is different from the cost of interest and changes its value in the same direction as that of the change in the value of the cost of interest upon changing the exposure conditions. In this embodiment, a line width error RMS (that is, the difference between the size (target value) of the target pattern and the size of the mask pattern image formed on the image plane of the projection optical system) in best focus is selected as the auxiliary cost.

In step S108, the optimization cost (evaluation function) that is the function including the cost of interest and the auxiliary cost as values is set by combining the cost of interest and the auxiliary cost. In this embodiment, the optimization cost is set in the following way.

Cost of interest: common line width DOF (nm)
Auxiliary cost: line width error RMS (nm) in best focus
Optimization cost: cost of interest−auxiliary cost If the exposure conditions are not appropriate, the common line width DOF selected as the cost of interest may take a value of 0. On the other hand, the line width error RMS is not an evaluation item that continuously takes a specific value (for example, 0) independently of the exposure conditions. The line width error RMS is an evaluation item which changes the value continuously and sensitively (more sensitively than the common line width DOF) in accordance with the change in the exposure conditions. Hence, combining the common line width DOF serving as the cost of interest and the line width error RMS serving as the auxiliary cost allows to set the optimization cost whose value changes sensitively in accordance with the change in the exposure conditions.

In addition, as the auxiliary cost, an evaluation item that takes a value (absolute value) smaller than the value (absolute value) of the cost of interest for exposure conditions that the value of the cost of interest is obtained, needs to be selected. For example, if the weight of the auxiliary cost relative to the optimization cost is large, the exposure conditions are optimized mainly considering not the cost of interest but the auxiliary cost. In this embodiment, the value of the line width error RMS selected as the auxiliary cost is much smaller than the value of the common line width DOF selected as the cost of interest for exposure conditions with which the DOF can appropriately be obtained. Hence, even when the optimization cost is set by combining the cost of interest and the auxiliary cost, the exposure conditions can actually be optimized considering only the common line width DOF selected as the cost of interest. Note that if the value of the auxiliary cost is not smaller than that of the cost of interest, the unit of the auxiliary cost may be adjusted, or the value of the auxiliary cost may be multiplied by a coefficient to reduce the weight of the auxiliary cost relative to the optimization cost.

The smaller the value of the line width error RMS in best focus is, the higher the possibility that the common line width DOF becomes large is. Hence, it will be understood that an evaluation item that changes its value in the same direction as that of the change in the value of the cost of interest upon changing the exposure conditions is preferably selected as the auxiliary cost, as described above, instead of selecting the auxiliary cost independently of the cost of interest.

The sign of the auxiliary cost when combining the cost of interest and the auxiliary cost will be explained. When combining the cost of interest and the auxiliary cost, it is necessary to make the direction in which the value of the cost of interest comes closer to the target value match the direction in which the value of the auxiliary cost comes closer to the target value. For example, the common line width DOF preferably has a value (positive value) as large as possible. On the other hand, the line width error RMS preferably has a value as small as possible. Hence, to maximize the optimization cost as in this embodiment, the line width error RMS serving as the auxiliary cost needs to be given a minus sign and combined with the common line width DOF serving as the cost of interest.

In step S110, the parameter values set in step S102 are changed to make the optimization cost value closer to the target value. The optimization cost value is calculated for each of a plurality of optical images formed on the image plane of the projection optical system in correspondence with the parameter values. Note that the parameter values included in the exposure conditions are changed in accordance with a specific mathematical method or algorithm. In this embodiment, the parameter values are changed using the downhill simplex method. However, any other method such as the simulated annealing method or the Monte Carlo method may be used to change the parameter values.

Note that in the downhill simplex method, when the change count of a parameter value is small (that is, at the initial stage), the parameter value is changed using a random number, and the optimization cost value is calculated for the optical image corresponding to the parameter value. After the parameter value has been changed a predetermined number of times using a random number, the change of the parameter value is repeated in consideration of each optimization cost value (such that the optimization cost value comes closer to the target value). When the parameter values are changed in consideration of the optimization cost value in this way, the parameter value change range gradually becomes narrow, and finally, the parameter values converge (the exposure conditions are decided (optimized)).

In step S112, it is determined whether the parameter values have been changed a defined number of times (350 times, in this embodiment) (that is, whether the optimization cost value has been calculated the defined number of times). Note that the defined number of times that the parameter values are to be changed is set in advance (for example, when the parameters are set (S102)). If the parameter values have been changed the defined number of times, the process advances to step S114. If the parameter values have not been changed the defined number of times, the process advances to step S110 to continue calculating the optimization cost value.

As described above, in steps S110 and S112, the parameter values that define the exposure conditions are changed the defined number of times, and the optimization cost value is calculated for each of the plurality of images formed on the image plane of the projection optical system in correspondence with the parameter values.

In step S114, it is determined whether the plurality of optimization cost values calculated in step S110 include an optimization cost value that satisfies the target value (400 or more, in this embodiment) (that is, whether there exists at least one optimization cost value that satisfies the target value). Note that the target value of the optimization cost is set in advance (for example, when the optimization cost is set (S108)). If there is no optimization cost value that satisfies the target value, the process advances to step S116. If there is an optimization cost value that satisfies the target value, the process advances to step S118.

In step S116, it is determined whether to change the auxiliary cost. Note that the criterion of step S116 can be set either by the user or automatically. To change the auxiliary cost, the process returns to step S106 to select, as a new auxiliary cost, an evaluation item different from that currently selected as the auxiliary cost. Steps S108, S110, S112, and S114 are then executed in the same way as described above. If the auxiliary cost should not be changed, the process returns to step S110 to change the parameter values the defined number of times and calculate the optimization cost value for each of a plurality of images formed on the image plane of the projection optical system in correspondence with the parameter values.

In the above-described process, (the parameter values included in) the exposure conditions are optimized in consideration of not only the cost of interest but the optimization cost obtained by combining the cost of interest and the auxiliary cost. In step S118, it is determined whether to remove the auxiliary cost, that is, set a new optimization cost that is the function of only the cost of interest. Note that the criterion of step S118 can be set either by the user or automatically. However, removing the auxiliary cost is merely an example of new optimization cost setting. The new optimization cost is set by, for example, reducing the influence of the auxiliary cost in optimizing the optimization cost.

If no new optimization cost is to be set, the process advances to step S120 to decide the parameter values corresponding to the optimization cost value that satisfies the target value as the parameter values set in step S102.

To set a new optimization cost, the process advances to step S122 to set a new optimization cost that is the function of only the cost of interest selected in step S104 (that is, set the cost of interest itself as the optimization cost). Note that after step S114, the optimization cost value has got out of the state in which it continuously takes a specific value. Hence, even when the cost of interest (common line width DOF, in this embodiment) itself is set as the new optimization cost, the new optimization cost value never continuously takes a specific value, as described above.

When the new optimization cost is set, the process returns to step S110 to calculate the new optimization cost value, as described above. At this time, the parameter values included in the exposure conditions are changed the defined number of times from the parameter values corresponding to the optimization cost value that satisfies the target value (that is, the parameter values decided in step S120). In step S120, the parameter values corresponding to the optimization cost value that satisfies the target value from the new optimization cost value calculated in step S110 are newly decided as the parameter values set in step S102. Thus setting the new optimization cost that is the function of only the cost of interest enables to optimize the exposure conditions in consideration of only the cost of interest.

Figure 6:
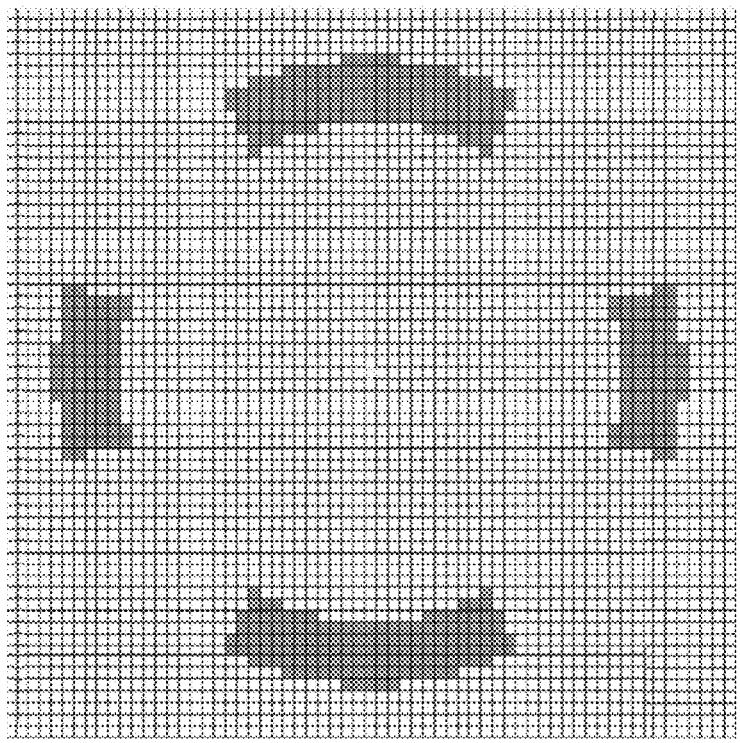
FIG. 6 is a view showing an example of the effective light source (shape).
Figure 7:
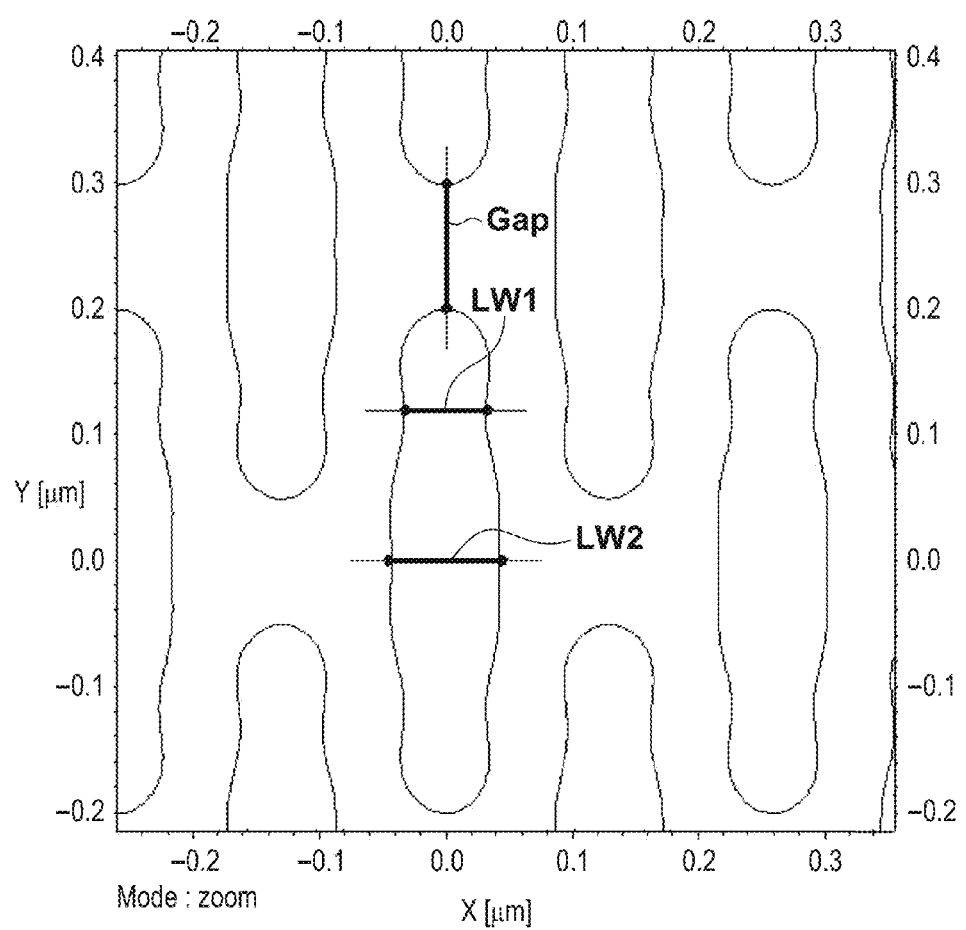
FIG. 7 is a view showing an example of the optical image formed on the image plane of the projection optical system.

The exposure conditions optimized (decided) in this embodiment will be described below in detail. The mask pattern MP shown in FIG. 5 is the mask pattern optimized in this embodiment. FIG. 6 shows the effective light source (shape) optimized in this embodiment. Table 1 shows the values of the eight parameters $P_A, P_B, P_C, P_D, \Psi_1, \Psi_2, \sigma_a$, and $\sigma_b$ that define the mask pattern shape and the effective light source shape optimized in this embodiment. In Table 1, the parameters $P_A, P_B, P_C$, and $P_D$ are expressed as "A", "B", "C", and "D", respectively. FIG. 7 is a view showing an example of the optical image formed on the image plane of the projection optical system when the effective light source shown in FIG. 6 illuminates the mask pattern MP shown in FIG. 5.

TABLE 1

| | | |
|---|---|---|
| A | 122.74 | nm |
| B | 97.45 | nm |
| C | 414.11 | nm |
| D | 55.05 | nm |
| $\sigma_a$ | 0.860 | |
| $\sigma_b$ | 0.682 | |
| $\Psi_1$ | 32.43 | degrees |
| $\Psi_2$ | 56.27 | degrees |

Figure 8:
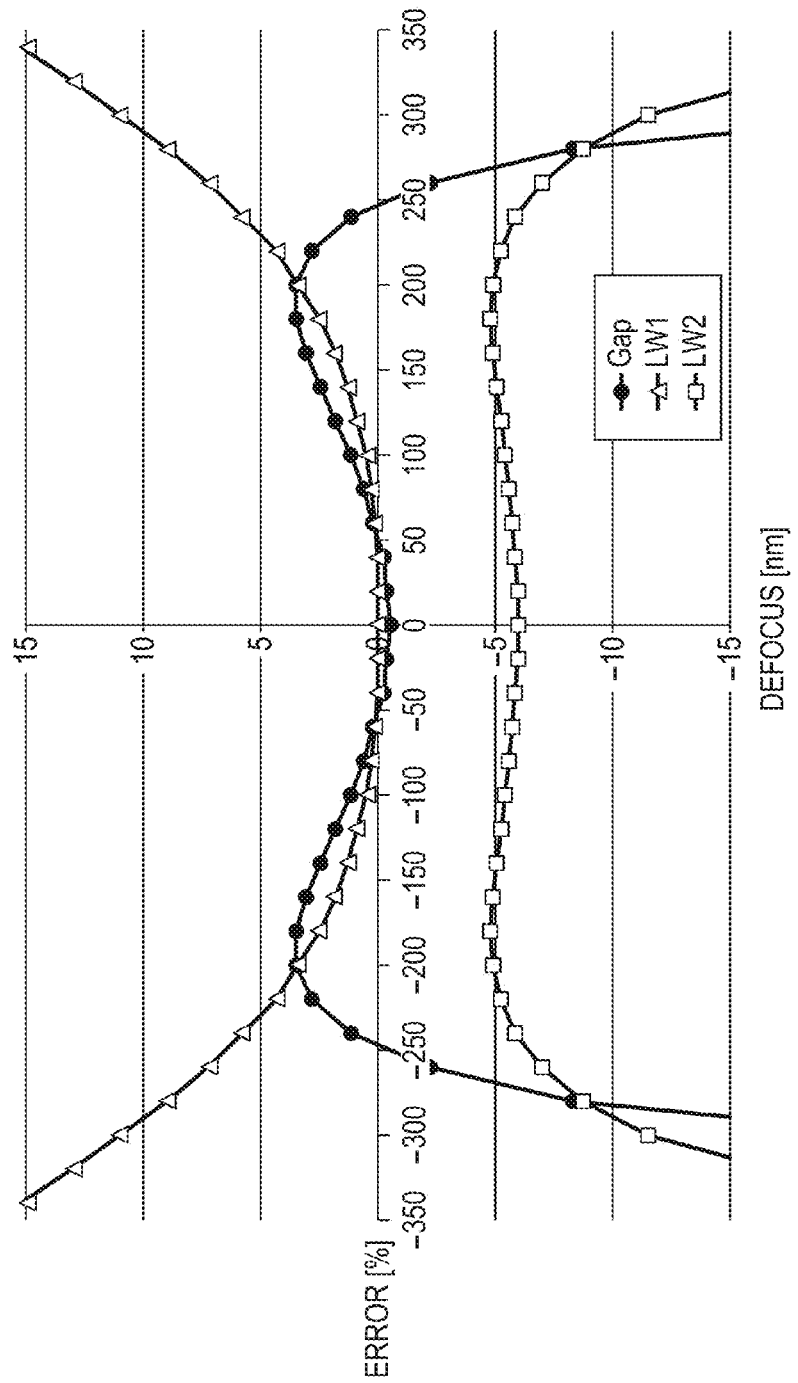
FIG. 8 is a graph showing the defocus dependence of the optical image formed on the image plane of the projection optical system.

FIG. 8 shows the defocus dependence of the line widths LW1 and LW2 and the interval Gap of the optical image formed on the image plane of the projection optical system in correspondence with these exposure conditions. In FIG. 8, the abscissa adopts the defocus value (nm), and the ordinate adopts the relative errors (%) of the line widths LW1 and LW2 and the interval Gap to their target values. Referring to FIG. 8, the common line width DOF representing the defocus range in which all the relative errors of the line widths LW1 and LW2 and the interval Gap are ±10% or less proves to have a very large value of 566.8 nm.

Figure 9A:
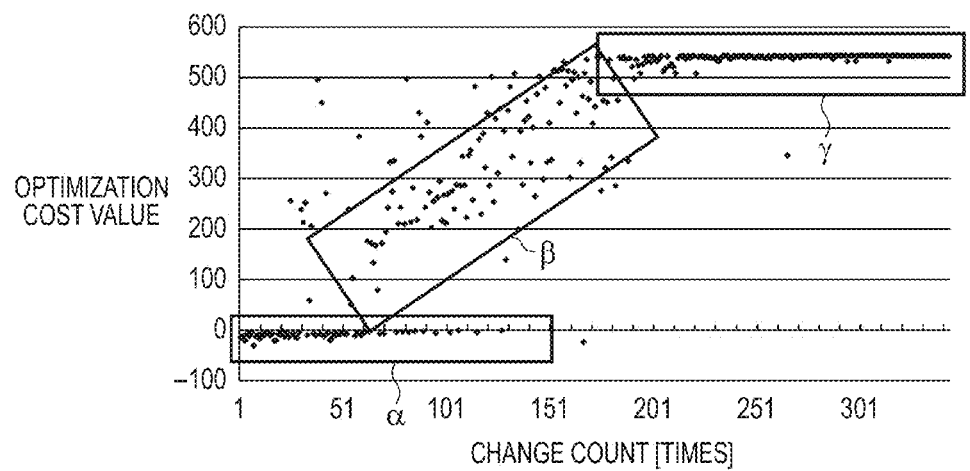
FIGS. 9A and 9B are graphs showing a change in the optimization cost value in exposure condition optimization according to the embodiment.
Figure 9B:
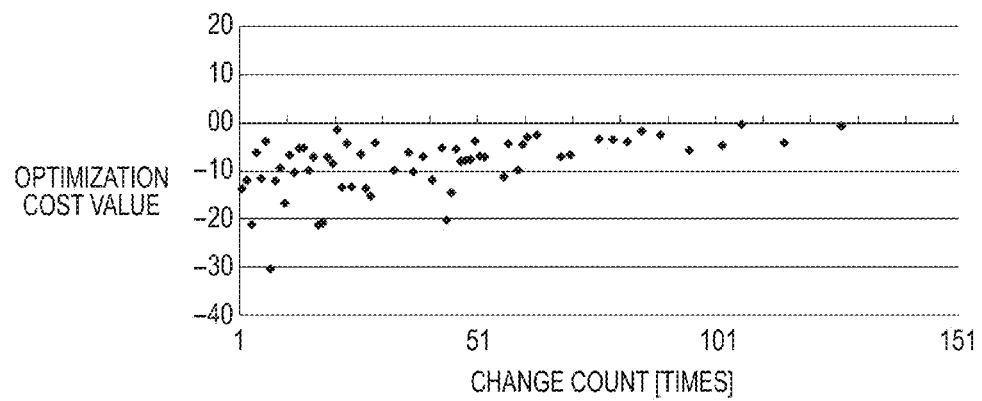

FIG. 9A is a graph showing a change in the optimization cost value in exposure condition optimization according to this embodiment. FIG. 9B is an enlarged view of a region α out of regions α, β, and γ shown in FIG. 9A. In FIGS. 9A and 9B, the abscissa adopts the change count of (the parameters included in) the exposure conditions, and the ordinate adopts the optimization cost value.

Referring to FIG. 9A, in the region α (the stage where the exposure condition change count is small), the value of the common line width DOF serving as the cost of interest cannot be obtained (that is, becomes 0) in many cases. Hence, the optimization cost value is dominated by the auxiliary cost value. As is apparent from FIG. 9B, in the region α, as the change count increases, the optimization cost value gradually becomes large. This means that the exposure conditions are changed in the direction in which the value of line width error RMS serving as the auxiliary cost decreases.

When the value of the line width error RMS becomes small, the value of the common line width DOF is obtained (takes a value other than 0). This is because the direction in which the value of the line width error RMS becomes small and the direction in which the value of the common line width DOF becomes large have the same tendency for the change in the exposure conditions.

The region β represents the stage where the common line width DOF is obtained. Referring to FIG. 9A, at the stage where the exposure condition change count exceeds 50, the value of the common line width DOF is obtained almost in ½ the cases. However, when the exposure condition change count exceeds 100, the value of the common line width DOF is obtained almost in all cases. Since the value of the line width error RMS is much smaller than that of the common line width DOF, as described above, the optimization cost value is dominated by the value of the common line width DOF serving as the cost of interest (that is, can be regarded as the value of the common line width DOF) at this stage. In the region β, the exposure conditions are changed such that the value of the common line width DOF gradually increases.

The region γ represents the stage where exposure condition change count further increases. In the region γ, the change amount of the optimization cost value decreases. When the exposure condition change count exceeds 300, the optimization cost value hardly changes. The parameter values included in the exposure conditions converge to decide the exposure conditions.

As described above, in this embodiment, even when the value of the cost of interest cannot be obtained (that is, the direction to change the exposure conditions is unknown), the direction to change the exposure conditions can be decided because the value of the auxiliary cost always changes. When the direction to change the exposure conditions is decided, the value of the cost of interest is obtained in course of time. Finally, the cost of interest dominates the optimization cost value, and the exposure conditions are optimized (the parameter values included in the exposure conditions converge).

Figure 10:
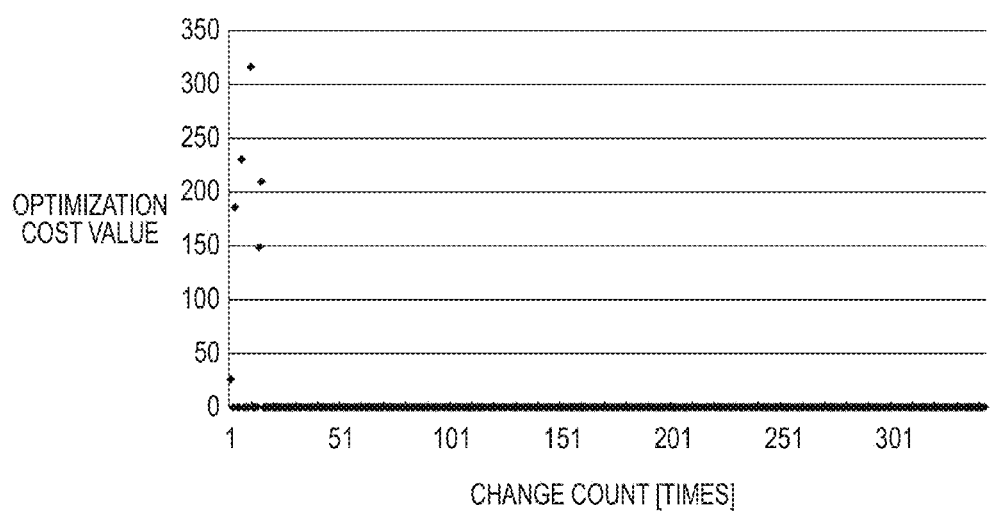
FIG. 10 is a graph showing a change in the optimization cost value in exposure condition optimization according to a related art.

Exposure condition optimization by the related art (that is, the auxiliary cost is not taken into consideration) will be described as a comparative example. In the related art, the evaluation item of interest (cost of interest) is directly set as the optimization cost. Hence, the common line width DOF is directly set as the optimization cost. FIG. 10 is a graph showing a change in the optimization cost value in exposure condition optimization according to the related art. In the exposure condition optimization according to the related art as well, the parameter values included in the exposure conditions are changed using the downhill simplex method, as in this embodiment.

Referring to FIG. 10, even when the change count of (the parameter values included in) the exposure conditions is increased, the value of the optimization cost (common line width DOF) is 0. In the related art, the value of the common line width DOF is directly set as the optimization cost value, the value of the common line width DOF continuously takes the value of 0 even after the exposure conditions have been changed.

At the stage where the exposure condition change count is small, as described above, an exposure condition is set using a random number, and the optimization cost value is calculated (feature of the downhill simplex method). In some cases, the common line width DOF is be obtained (a value other than 0 is obtained) by this method. However, if the optimization cost value is continuously 0 upon changing the exposure conditions, the direction to change the exposure conditions cannot be known. Not the optimization cost value taking the value of 0 but the optimization cost value taking the same value (that is, remaining unchanged) even after the change of the exposure conditions is problematic here. In the downhill simplex method, (the parameter values included in) the exposure conditions are changed based on the change in the optimization cost value. For this reason, if the optimization cost value does not change, it is impossible to decide the direction to change the exposure conditions. In the exposure condition optimization of the related art shown in FIG. 10, the solution converges in the region where the value of the common line width DOF serving as the optimization cost value cannot be obtained, and the exposure conditions cannot be optimized.

Figure 11:
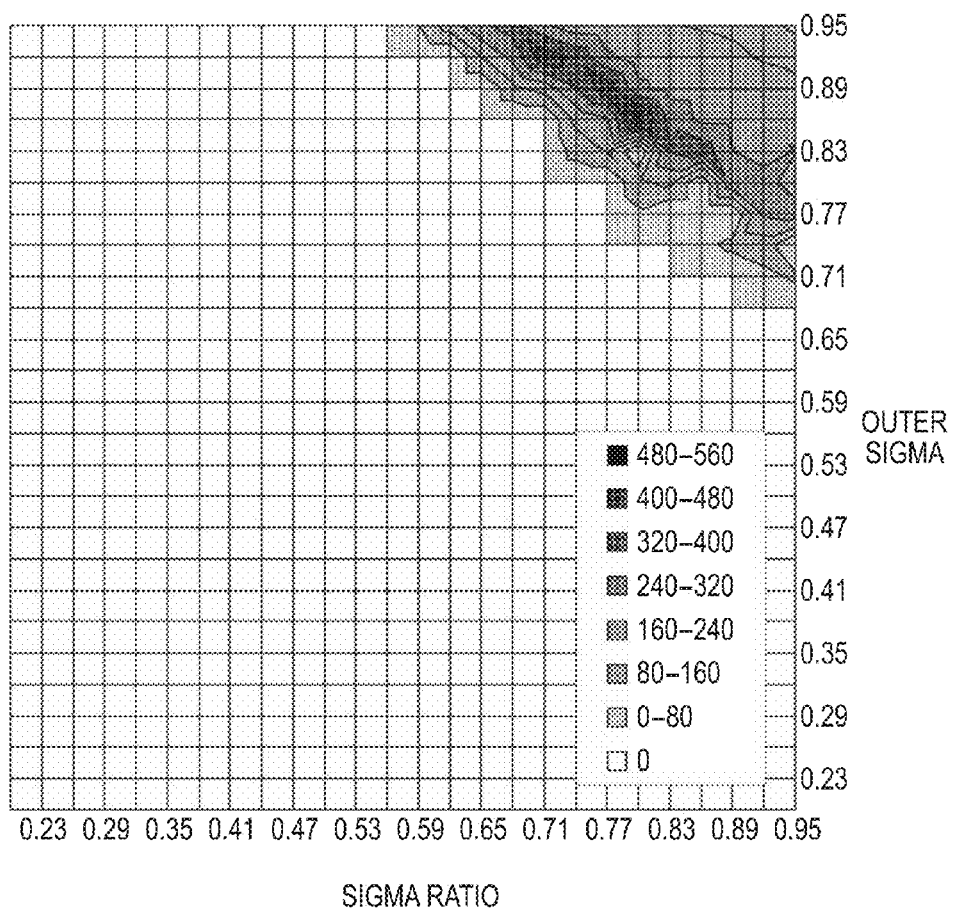
FIG. 11 is a view showing that the range in which the value of the common line width DOF can be obtained for each exposure condition is very narrow.

In the related art, the solution convergence in the region where the value of the common line width DOF cannot be obtained will be described. FIG. 11 is a view showing that the range in which the value of the common line width DOF can be obtained for each exposure condition is very narrow. In FIG. 11, the abscissa adopts the sigma ratio (the ratio between the inner sigma value $\sigma_b$ and the outer sigma value $\sigma_a$), the ordinate adopts the outer sigma value $\sigma_a$, and the value of the common line width DOF corresponding to each condition is plotted. Note that the parameters included in the remaining exposure conditions (the parameters $P_A$, $P_B$, $P_C$, and $P_D$ that define the mask pattern shape and the parameters $\Psi_1$ and $\Psi_2$ that define the effective light source shape) have the values (optimum values) shown in Table 1.

Referring to FIG. 11, the value of the common line width DOF is 0 in most regions. As is apparent, the region where the value of the common line width DOF can be obtained is very small although only the two parameters $\sigma_a$ and $\sigma_b$ are changed (the remaining parameters have the optimum values). Actually, since there are many parameters to be optimized, the number of combinations of the parameter values is very large, and the optimization space is larger than that shown in FIG. 11. In such a large optimization space, the number of combinations of the parameter values for which the value of the common line width DOF (a value other than 0) is obtained is very small, and the common line width DOF often continuously takes the value of 0.

Figure 12:
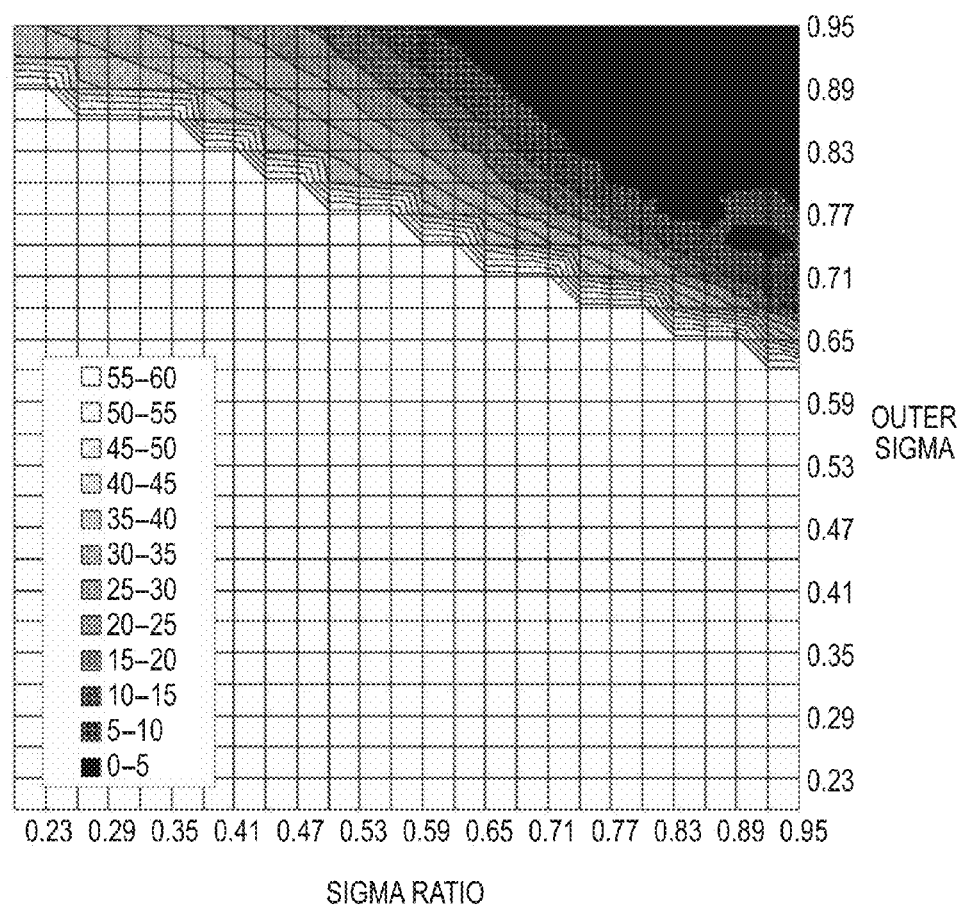
FIG. 12 is a view showing the value of a line width error RMS in best focus for each exposure condition.

The line width error RMS in best focus that is selected as the auxiliary cost will be described. FIG. 12 is a view showing the value of the line width error RMS for each exposure condition. In FIG. 12, the abscissa adopts the sigma ratio (the ratio between the inner sigma value $\sigma_b$ and the outer sigma value $\sigma_a$), the ordinate adopts the outer sigma value $\sigma_a$, and the value of the line width error RMS (nm) in best focus corresponding to each condition is plotted. As is apparent from comparison between FIG. 11 and FIG. 12, the direction in which the value of the common line width DOF comes closer to the target value (that is, the condition to increase the value) is the same as the direction in which the value of the line width error RMS comes closer to the target value (that is, the condition to decrease the value).

As described above, the direction in which the value of the cost of interest comes closer to the target value needs to be the same as the direction in which the value of the auxiliary cost comes closer to the target value. In this embodiment, as shown in FIGS. 11 and 12, the direction in which the value of the common line width DOF comes closer to the target value and the direction in which the value of the line width error RMS in best focus comes closer to the target value are the same in general, and the combination of the cost of interest and the auxiliary cost is appropriate. More specifically, as shown in FIGS. 11 and 12, when the outer sigma value and the sigma ratio are changed in a specific range, the change amounts (that is, the differential values) of the common line width DOF and the line width error RMS have the same tendency. Note that the common line width DOF and the line width error RMS have the same relationship concerning the change amounts even for parameters other than the outer sigma and the sigma ratio.

When selecting the auxiliary cost for the cost of interest, for example, the signs of the differential values obtained by changing the parameter values included in the exposure conditions are compared, thereby specifying the evaluation item to be set as the auxiliary cost, as described above. Note that the step of specifying the evaluation item to be set as the auxiliary cost may be provided between step S104 and step S106. In addition, a table representing the correspondence relationship between a plurality of evaluation items (a preferable combination of the auxiliary cost with respect to the cost of interest (the line width error RMS in best focus with respect to the common line width DOF, in this embodiment)) may be created in advance, and the auxiliary cost may be selected by referring to the table. If the user knows the evaluation item to be selected (that is, preferable) as the auxiliary cost with respect to the evaluation item selected as the cost of interest in advance, the user may instruct to select the evaluation item as the auxiliary cost. Note that selecting the auxiliary cost with respect to the cost of interest is not limited to those described above. It is necessary to only select an evaluation item that changes its value in the same direction as that of the change in the value of the cost of interest.

As described above, in this embodiment, the function of the cost of interest and the auxiliary cost is set as the optimization cost instead of directly setting the evaluation item of interest. Even if the value of the cost of interest remains unchanged regardless of the change in the exposure conditions, the value of the auxiliary cost changes. It is therefore possible to know the direction to change the exposure conditions and optimize the exposure conditions.

Second Embodiment

In the second embodiment, a case will be explained in which a common exposure margin DOF for line widths LW1 and LW2 and an interval Gap of an optical image OI shown in FIG. 5 is selected as a cost of interest in step S104. The exposure margin represents an exposure amount range in which the relative error between the line width of an optical image and its target value is ±10% or less at a certain focal point. An exposure margin common to all the line widths LW1 and LW2 and the interval Gap is defined as a common exposure margin. In this embodiment, a focal point range where the common exposure margin can be obtained as 10% or more of the exposure amount will be referred to as the common exposure margin DOF. The larger the value of the common exposure margin DOF is, the more hardly the line widths of the formed optical image change for the shift of the exposure amount and the shift of the focal point of the projection optical system.

In step S106, a common exposure margin in best focus is selected as an auxiliary cost for the common exposure margin DOF selected as the cost of interest. Hence, in step S108, the optimization cost is set in the following way.

Cost of interest: common exposure margin DOF (nm)
Auxiliary cost: common exposure margin (%) in best focus
Optimization cost: cost of interest+auxiliary cost The larger the value of the common exposure margin in best focus is, the larger the value of the common exposure margin DOF is. Since the common exposure margin in best focus changes its value in the same direction as that of the change in the value of the common exposure margin DOF upon changing the exposure conditions, the common exposure margin in best focus is suitable as the auxiliary cost for the common exposure margin DOF.

Table 2 shows the values of eight parameters $P_A$, $P_B$, $P_C$, $P_D$, $\Psi_1$, $\Psi_2$, $\sigma_a$, and $\sigma_b$ that define the mask pattern shape and the effective light source shape optimized in this embodiment. In Table 2, the parameters $P_A$, $P_B$, $P_C$, and $P_D$ are expressed as "A", "B", "C", and "D", respectively. The parameter values included in the exposure conditions are changed using the downhill simplex method, as in the first embodiment, and the change count is 650. The target value of the optimization cost value is 200 or more.

TABLE 2

| A | 143.05 | nm |
|---|---|---|
| B | 110.49 | nm |
| C | 403.55 | nm |
| D | 57.03 | nm |
| $\sigma_a$ | 0.873 | |
| $\sigma_b$ | 0.690 | |
| $\Psi_1$ | 70.68 | degrees |
| $\Psi_2$ | 41.43 | degrees |

Figure 13:
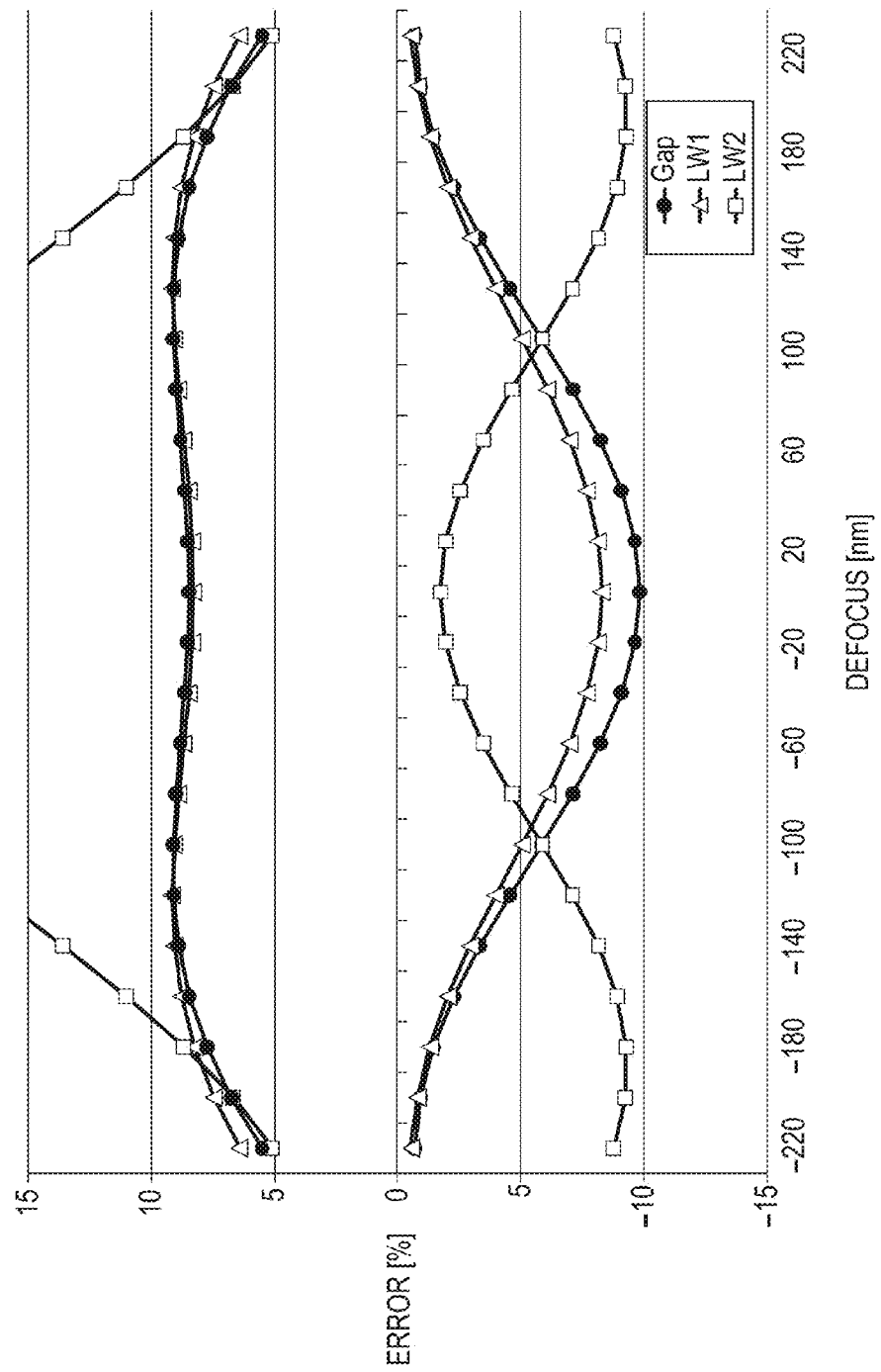
FIG. 13 is a graph showing the defocus dependence of the optical image formed on the image plane of the projection optical system.

FIG. 13 shows the defocus dependence of the line widths LW1 and LW2 and the interval Gap of the optical image formed on the image plane of the projection optical system in correspondence with these exposure conditions. In FIG. 13, the abscissa adopts the defocus value (nm), and the ordinate adopts the ratio (%) of the exposure amount to the reference exposure amount at which the relative errors (%) of the line widths LW1 and LW2 and the interval Gap to their target values are ±10% or less. The region surrounded by the six plot curves shown in FIG. 13 represents a combination of the exposure amount and the focal point with which the errors of the line widths LW1 and LW2 and the interval Gap are ±10% or less. Referring to FIG. 13, the common exposure margin DOF is 332.5 nm.

Figure 14:
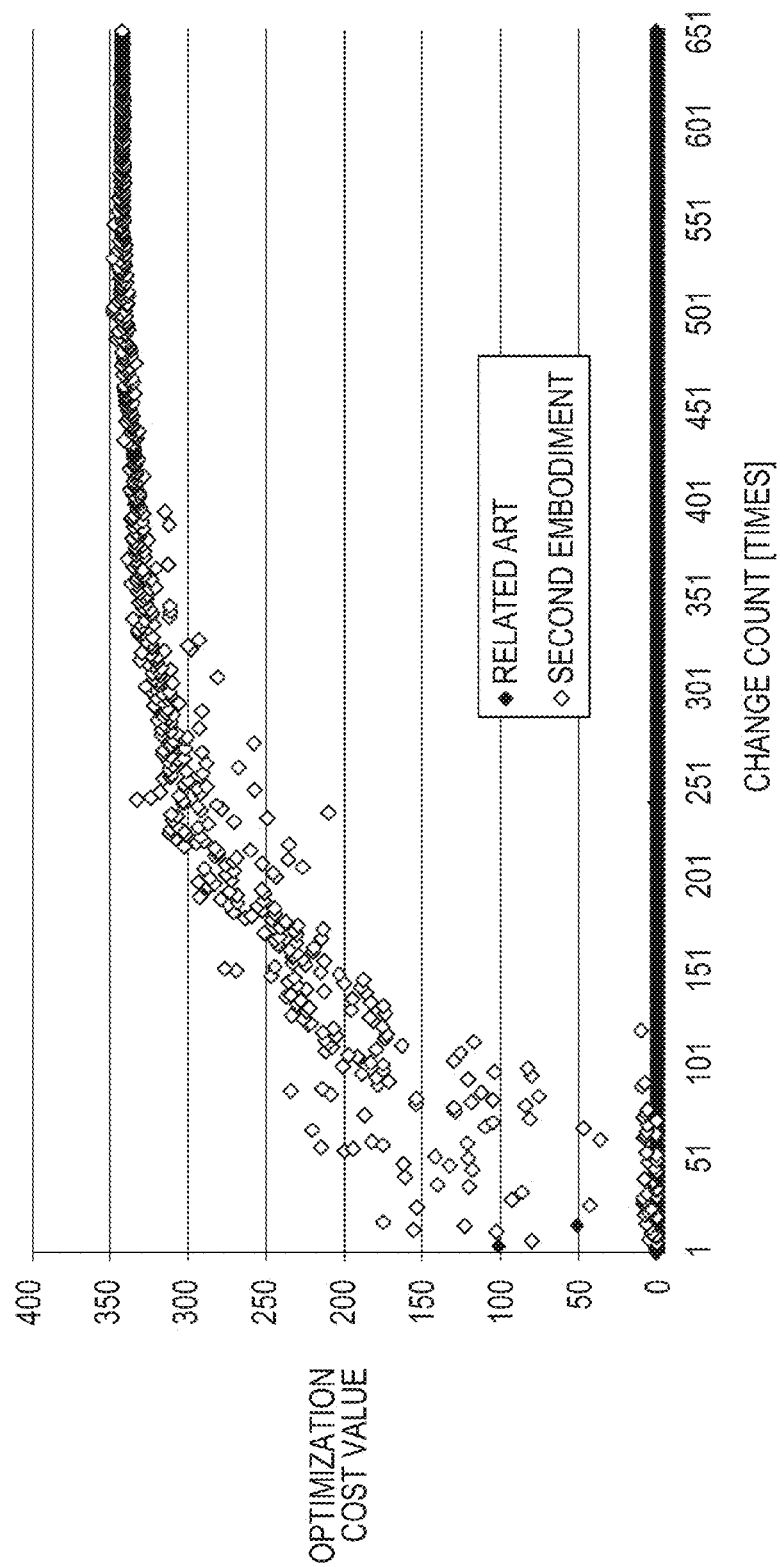
FIG. 14 is a graph showing changes in the optimization cost value in exposure condition optimization according to the embodiment and the related art.

FIG. 14 is a graph showing changes in the optimization cost value in exposure condition optimization according to the embodiment and the related art. In FIG. 14, the abscissa adopts the change count of (the parameters included in) the exposure conditions, and the ordinate adopts the optimization cost value.

Exposure condition optimization according to this embodiment will be described. Referring to FIG. 14, at the stage where the exposure condition change count is small, the value of the common exposure margin DOF serving as the optimization cost cannot be obtained (that is, becomes 0) in many cases. Hence, for the optimization cost value, the direction to change the exposure conditions is decided by the value of the common exposure margin in best focus serving as the auxiliary cost. When the exposure condition change count exceeds is almost 50, the value of the common exposure margin DOF is obtained, and the optimization cost value is dominated by the value of the common exposure margin DOF serving as the cost of interest. When the exposure condition change count exceeds 120, the value of the common exposure margin DOF is always obtained. The parameter values included in the exposure conditions converge (are maximized), and the exposure conditions are decided.

On the other hand, in exposure condition optimization according to the related art, the value of the common exposure margin DOF continuously takes the value of 0 even after the change of the exposure conditions. Hence, the direction to change the exposure conditions is unknown. In the exposure condition optimization according to the related art, the solution converges in the region where the value of the common exposure margin DOF serving as the optimization cost value is not obtained, and the exposure conditions cannot be optimized.

Third Embodiment

As described above, the present invention features setting the function of a cost of interest and an auxiliary cost as an optimization cost (that is, selecting (setting) an auxiliary cost) instead of directly setting the evaluation item of interest as the optimization cost. Note that (the evaluation item to be selected as) the auxiliary cost can be changed in step S106. In addition, the optimization cost from which the auxiliary cost is removed, that is, the optimization cost that is the function of only the cost of interest can be set in step S122.

However, changing the auxiliary cost and setting the optimization cost are not limited to the flowchart shown in FIG. 1. For example, (the evaluation item to be selected as) the auxiliary cost may be changed in accordance with the exposure condition change count. When the exposure condition change count is still small, the optimization cost may be set by adding the cost of interest and the auxiliary cost at a ratio of 1:1. As the exposure condition change count increases, the optimization cost may be set by decreasing the weight of the auxiliary cost.

Alternatively, instead of setting the auxiliary cost from the beginning, the auxiliary cost may be set when the exposure condition change count has reached a certain value. More specifically, the auxiliary cost may be set when the optimization cost has continuously taken the same value, as in the related art.

The evaluation item to be selected as the auxiliary cost is not limited to one physical quantity. A plurality of evaluation items may be selected as the auxiliary cost. For example, not only the line width error RMS but the line width error RMS and the NILS may be selected as the auxiliary cost in the first embodiment.

Fourth Embodiment

In the fourth embodiment, optimization (decision) of a mask pattern including an SRAF (Sub-Resolution Assist Feature) pattern will be described. The SRAF pattern which is also called an auxiliary pattern is inserted to improve the performance of the image of the main pattern. Hence, the SRAF pattern needs to remain unresolved on the substrate.

Figure 15:
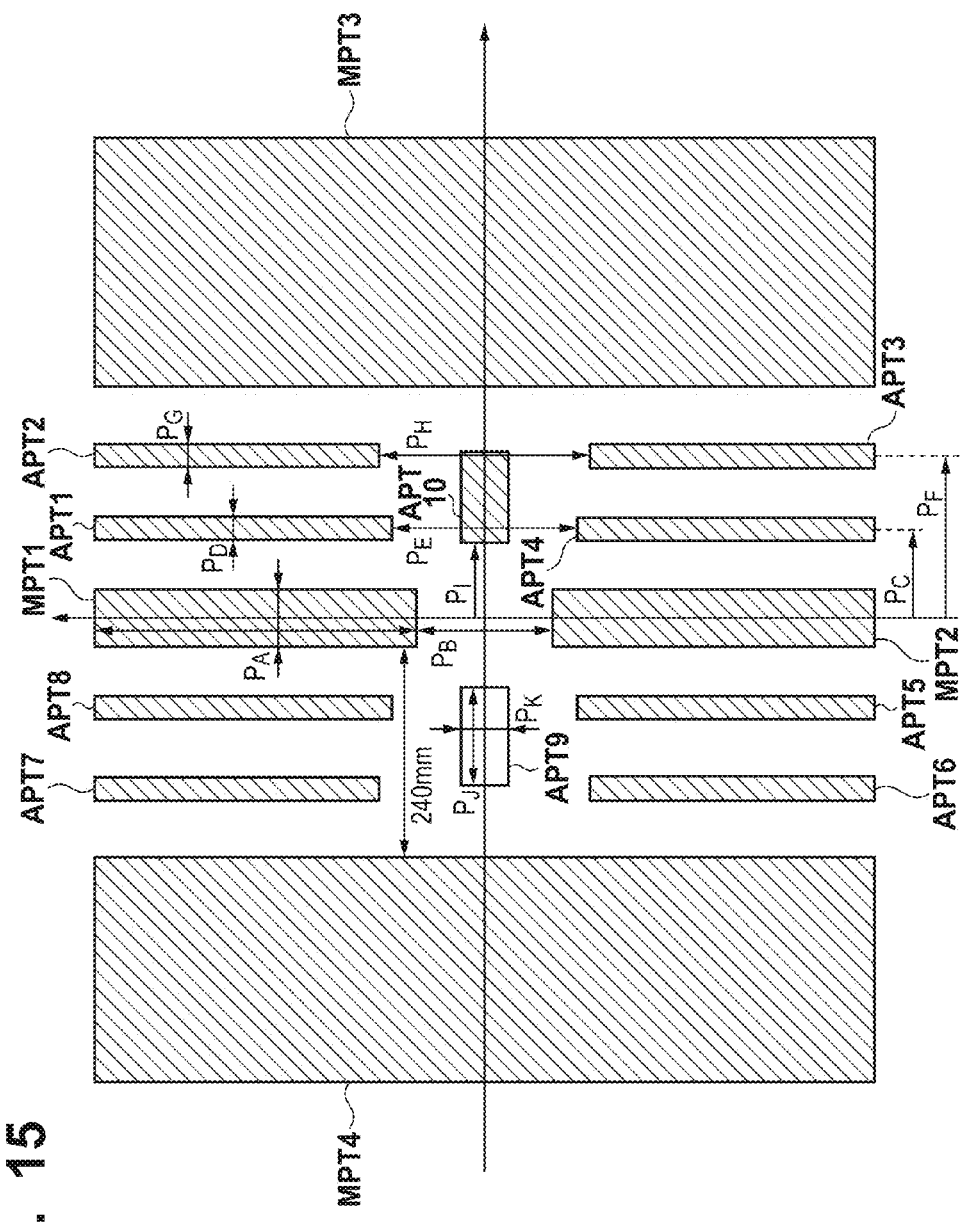
FIG. 15 is a view showing an example of parameters that define a mask pattern shape.

Concerning the mask pattern, in this embodiment, parameters $P_A$, $P_B$, $P_C$, $P_D$, $P_E$, $P_F$, $P_G$, $P_H$, $P_I$, $P_J$, and $P_K$ that define the shape of a pattern (mask pattern) characteristic in a metal process are set, as shown in FIG. 15. The pattern shown in FIG. 15 includes, as main patterns called In-Between, main patterns MPT1 and MPT2, and main patterns MPT3 and MPT4 arranged around the main patterns MPT1 and MPT2. The pattern shown in FIG. 15 also includes, as SRAF patterns, SRAF patterns APT1, APT2, APT3, APT4, APT5, APT6, APT7, APT8, APT9, and APT10. The parameter $P_A$ represents the length of a side of the main patterns MPT1 and MPT2. The parameter $P_B$ represents the interval between the main patterns MPT1 and MPT2. The parameter $P_C$ represents the interval between the X-coordinate of the middle point of the main pattern MPT2 and the X-coordinate of the middle point of the SRAF pattern APT4. The parameter $P_D$ represents the length of a side of the SRAF pattern APT1. The parameter $P_E$ represents the interval between the SRAF patterns APT1 and APT4. The parameter $P_F$ represents the interval between the X-coordinate of the middle point of the main pattern MPT2 and the X-coordinate of the middle point of the SRAF pattern APT3. The parameter $P_G$ represents the length of a side of the SRAF pattern APT2. The parameter $P_H$ represents the interval between the SRAF patterns APT2 and APT3. The parameter $P_I$ represents the interval between the X-coordinate of the middle point of the main pattern MPT2 and the X-coordinate of the left end of the SRAF pattern APT10. The parameters $P_J$ and $P_K$ represent the lengths of sides of the SRAF pattern APT9, respectively.

Figure 16:
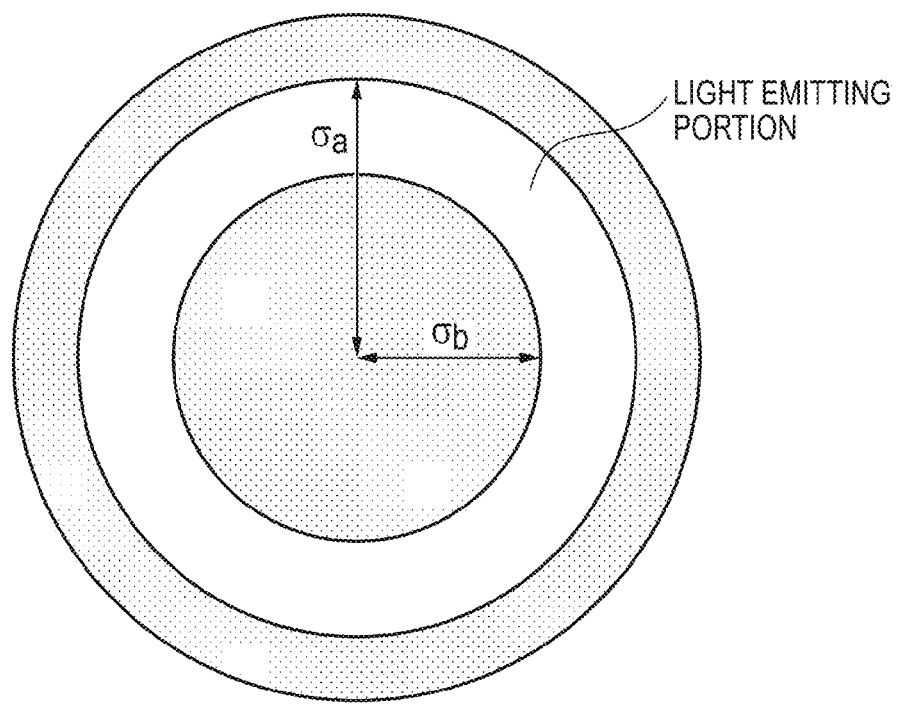
FIG. 16 is a view showing an example of parameters that define an effective light source shape.

Concerning the effective light source, in this embodiment, parameters $\sigma_a$ and $\sigma_b$ that define the shape of annular illumination are set, as shown in FIG. 16. The parameter $\sigma_a$ represents the outer sigma value, and the parameter $\sigma_b$ represents the inner sigma value.

As described above, in this embodiment, the 13 parameters $P_A$, $P_B$, $P_C$, $P_D$, $P_E$, $P_F$, $P_G$, $P_H$, $P_I$, $P_J$, and $P_K$, $\sigma_a$, and $\sigma_b$ that define the mask pattern shape and the effective light source shape are set. Note that as for the other exposure conditions, the NA of the projection optical system (immersion) is set (fixed) to 1.35, the wavelength of exposure light to 193 nm, and the polarization state of the exposure light to tangential polarization in this embodiment.

Figure 17:
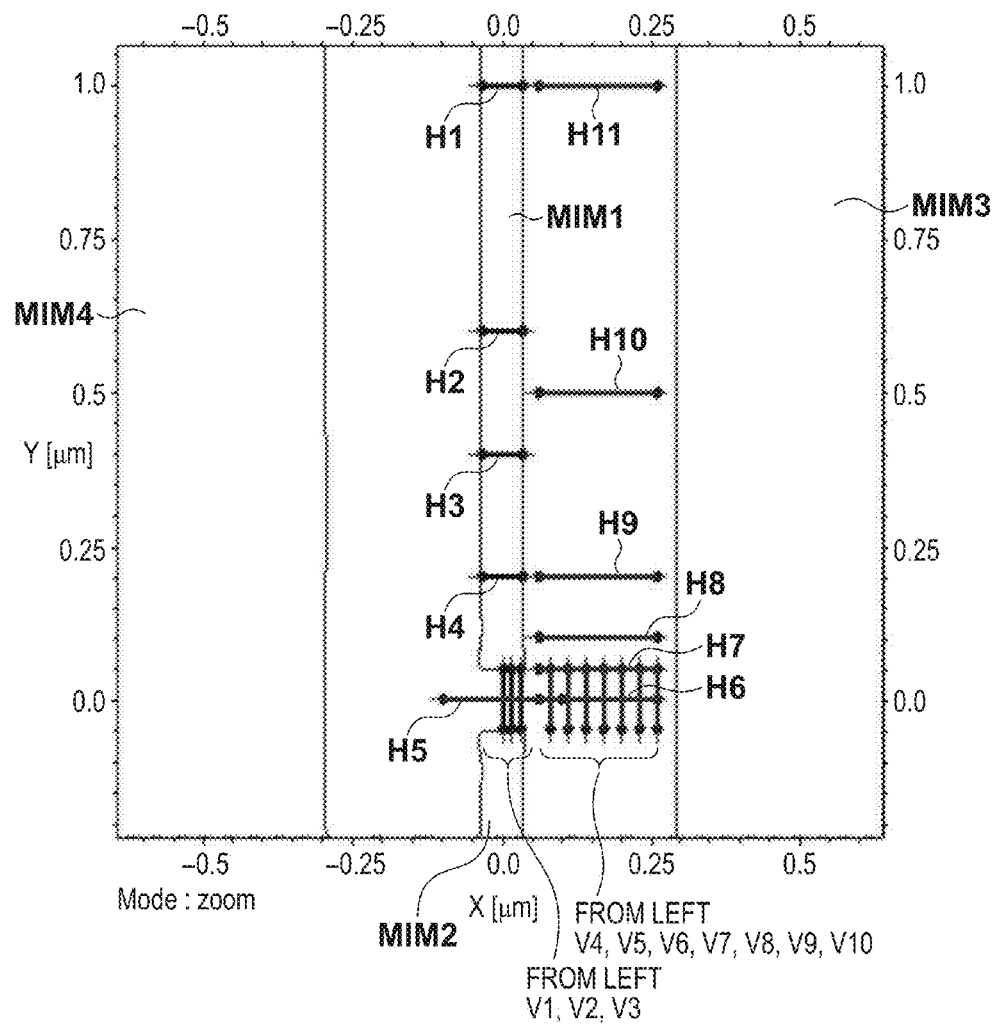
FIG. 17 is a view showing an example of the optical image formed on the image plane of the projection optical system.

The cost of interest to be set in this embodiment will be described. FIG. 17 is a view showing an example of the optical image formed on the image plane of the projection optical system when the effective light source (annular illumination) shown in FIG. 16 illuminates the mask pattern shown in FIG. 15. Optical images corresponding to the main patterns MPT1, MPT2, MPT3, and MPT4 are defined as MIM1, MIM2, MIM3, and MIM4, respectively. The horizontal line widths of the optical image MIM1 are defined as H1, H2, H3, and H4. The (vertical) intervals between the optical images MIM1 and MIM2 are defined as V1, V2, and V3. The target value of the line widths H1, H2, H3, and H4 is 70 nm. The target value of the intervals V1, V2, and V3 is 100 nm. In this embodiment, for each of the line widths H1 to H4 and the intervals V1 to V3 of the optical image of the main pattern, an error RMS from the corresponding target value is selected as the cost of interest. The error RMS is preferably as small as possible, optimizing the optimization cost value means minimizing the optimization cost value.

The auxiliary cost and the optimization cost value to be set in this embodiment will the described. As shown in FIG. 17, the line widths of the virtual optical image corresponding to the SRAF patterns are defined as H5, H6, H7, H8, H9, H10, and H11. In addition, the line widths of the virtual optical image corresponding to the SRAF patterns are defined as V4, V5, V6, V7, V8, V9, and V10. The SRAF patterns are auxiliary patterns, as described above, and need to remain unresolved on the substrate. Hence, in this embodiment, the auxiliary cost and the optimization cost are set such that the optimization cost value becomes abnormal when the SRAF patterns are resolved, as will be described below. Note that H5, H6, H7, H8, H9, H10, H11, V4, V5, V6, V7, V8, V9, and V10 will be referred to as an SRAF evaluation line segment group hereinafter.

Cost of interest: error RMS (nm) of the line widths H1 to H4 and the intervals V1 to V3 of the optical image of the main pattern Auxiliary cost: 0 (when all the line widths of the SRAF evaluation line segment group are 0 nm)

200 (when at least one of the line widths of the SRAF evaluation line segment group is larger than 0 nm)

Optimization cost: cost of interest+auxiliary cost

The error RMS serving as the cost of interest has a value of several tens at maximum. Hence, the auxiliary cost value "200" is much larger than the error RMS. When the auxiliary cost is used as a scheme for determining abnormality as in this embodiment, the value (absolute value) the auxiliary cost can take is preferably larger than the value the cost of interest can take.

Table 3 shows the values of the 13 parameters $P_A$, $P_B$, $P_C$, $P_D$, $P_E$, $P_F$, $P_G$, $P_H$, $P_I$, $P_J$, and $P_K$, $\sigma_a$, and $\sigma_b$ that define the mask pattern shape and the effective light source shape optimized in this embodiment. In Table 3, the parameters $P_A$, $P_B$, $P_C$, $P_D$, $P_E$, $P_F$, $P_G$, $P_H$, $P_I$, $P_J$, and $P_K$ are expressed as "A", "B", "C", "D", "E", "F", "G", "H", "I", "J", and "K", respectively. Note that (the parameter values included in) the exposure conditions are changed using the downhill simplex method, as in the first and second embodiments. The value of the error RMS serving as the cost of interest is 0.38 nm.

TABLE 3

| A | 95.38 | nm |
|---|---|---|
| B | 71.83 | nm |
| C | 128.96 | nm |
| D | 31.24 | nm |
| E | 65.70 | nm |
| F | 209.29 | nm |
| G | 15.27 | nm |
| H | 224.88 | nm |
| I | 52.49 | nm |
| J | 35.75 | nm |
| K | 114.97 | nm |
| $\sigma_a$ | 0.836 | |
| $\sigma_b$ | 0.550 | |

Figure 19:
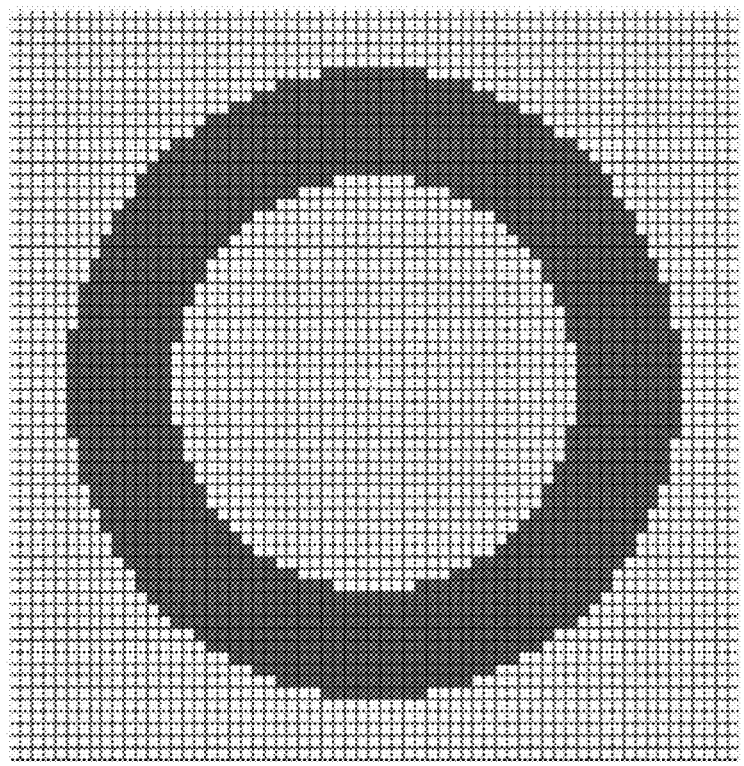
FIG. 19 is a view showing an example of the effective light source (shape).

FIG. 18 shows the mask pattern optimized in this embodiment. FIG. 19 shows the effective light source (shape) optimized in this embodiment. The optical image shown in FIG. 17 is formed on the image plane of the projection optical system when the effective light source shown in FIG. 19 illuminates the mask pattern shown in FIG. 18. As is apparent from FIG. 17, the SRAF patterns are not resolved, and the line width of the optical image corresponding to each main pattern can be adjusted to the target value at a high accuracy.

Figure 20:
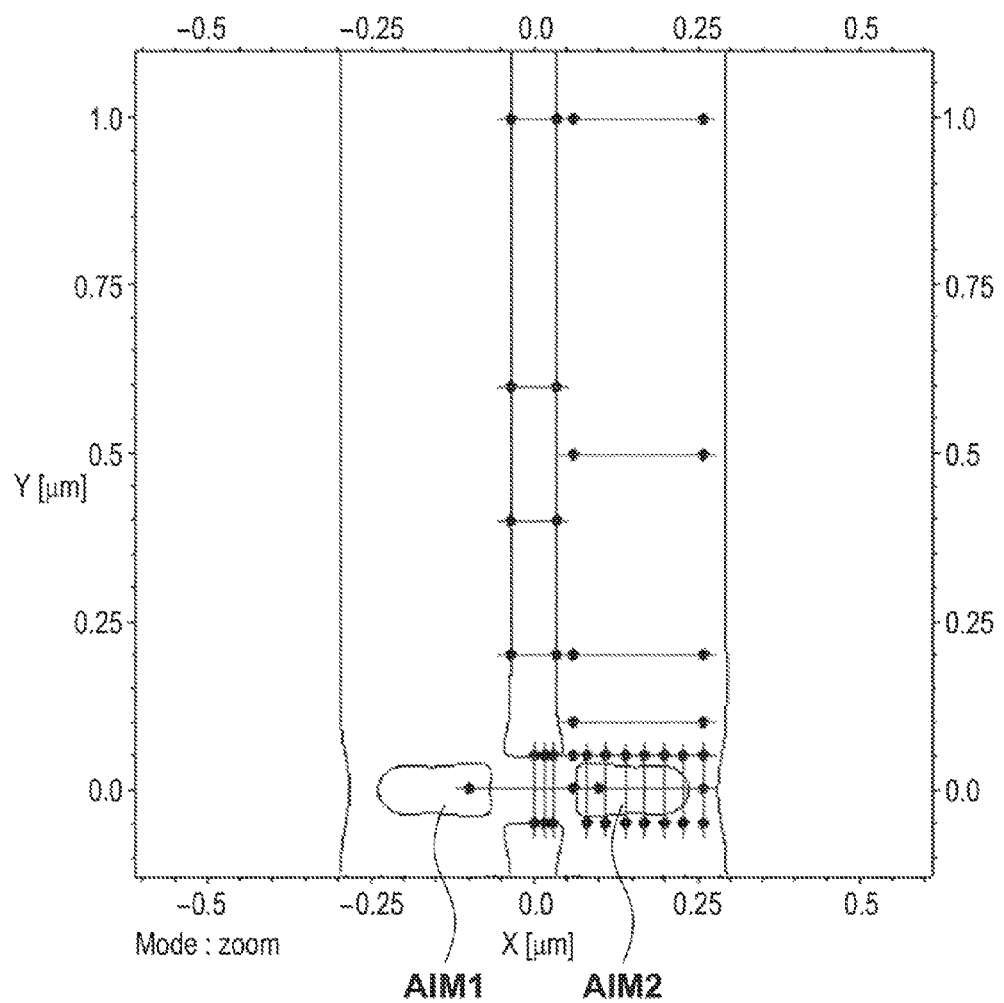
FIG. 20 is a view showing an optical image formed on the image plane of the projection optical system in correspondence with exposure conditions optimized in the related art.

FIG. 20 is a view showing an optical image formed on the image plane of the projection optical system in correspondence with exposure conditions (mask pattern and effective light source) optimized in the related art (that is, without considering the auxiliary cost). In the related art, although the value of the error RMS serving as the cost of interest is 0.35 nm, the SRAF patterns are resolved, as indicated by AIM1 and AIM2 in FIG. 20.

As described above, even when optimizing (deciding) the mask pattern including SRAF patterns, not directly setting the evaluation item of interest as the optimization cost but setting the function of the cost of interest and the auxiliary cost as the optimization cost is effective.

Fifth Embodiment

In the fourth embodiment, the auxiliary cost is set so as to add an abnormal value in case of resolution of SRAF patterns.

However, auxiliary cost setting is not limited to this. For example, the auxiliary cost may be set in association with resolution of not a specific pattern such as an SRAF pattern but the main pattern. For example, the auxiliary cost may be set to determine the presence/absence of a dimple in a hole pattern or determine resolution at a position of a mask pattern including no SRAF pattern where resolution should not occur.

A mask pattern that has undergone OPC (Optical Proximity Correction) often has a complex shape. Especially, a mask pattern including SRAF patterns inserted and having undergone OPC has a shape of high complexity. To meet the recent requirements of micropatterning, not only the shape but also factors such as the phase and transmittance are specified as parameters of a mask pattern. In general, image resolution at a position other than the position of the main pattern is desirably avoided. However, as the mask pattern becomes complex, it becomes more difficult to grasp the position of the risk of image resolution. In this case, the auxiliary cost can effectively be set to prevent image resolution at a position other than the position of the main pattern.

The positions to determine whether image resolution has occurred can be set at an appropriate pitch in, for example, a region apart from the main pattern by a predetermined distance. An evaluation line segment to be used to determine whether image resolution has occurred may be set throughout the region other than the position of the main pattern. The former is advantageous in reducing the time and data amount required for optimization. The latter is advantageous in more accurately determining the risk of image resolution.

Sixth Embodiment

In the fourth and fifth embodiments, a case has been described in which the auxiliary cost is used to add an abnormal value when resolution has occurred (the line width of an optical image has been obtained) at a position where resolution should not occur. However, the present invention is not limited to this. For example, an abnormal value may be added when NILS is smaller than a specific value, or MEEF is larger than a specific value. Note that MEEF is short for Mask Error Enhancement Factor and represents the magnitude of a dimensional error that occurs in a pattern projected onto a wafer when a dimensional error having a specific value has occurred in the pattern on a mask at the time of mask manufacture.

In the third embodiment, the value of the evaluation item (physical quantity) itself is taken into consideration as the auxiliary cost. However, the abnormality determination condition of the value of the evaluation item may be taken into consideration as the auxiliary cost. More specifically, the auxiliary cost may be set as follows.
Auxiliary cost: 0 (the value of NILS of a pattern of interest is 1.4 or more)
50 (the value of NILS of a pattern of interest is smaller than 1.4)
Auxiliary cost: 0 (the value of MEEF of a pattern of interest is smaller than 5)
100 (the value of MEEF of a pattern of interest is 5 or more)

Note that the evaluation item to set the auxiliary cost serving as the abnormality determination condition is not limited to a specific evaluation item.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2011-053556 filed on Mar. 10, 2011, which is hereby incorporated by reference herein in its entirety.

What is claimed is:

1. A non-transitory computer-readable storage medium storing a program that causes a computer to decide an exposure condition in an exposure apparatus including an illumination optical system for illuminating a mask, and a projection optical system for projecting an image of a pattern of the mask onto a substrate,
the program causing the computer to execute:
a first step of selecting an evaluation item of interest that is an evaluation item from a plurality of evaluation items calculated from an image formed on an image plane of the projection optical system in correspondence with the exposure condition for evaluating the image in comparison with a target pattern to be formed on the substrate;
a second step of selecting an auxiliary evaluation item from the plurality of evaluation items which is different from the evaluation item of interest and changes a value in the same direction as that of a change in a value of the evaluation item of interest upon changing a parameter value of the exposure condition;
a third step of setting an evaluation function including the evaluation item of interest and the auxiliary evaluation item as values;
a fourth step of changing the parameter value of the exposure condition so as to make a value of the evaluation function closer to a target value and calculating the value of the evaluation function for each of a plurality of images formed on the image plane of the projection optical system in correspondence with the changed parameter value of the exposure condition; and
a fifth step of deciding the parameter value of the exposure condition corresponding to a value of the evaluation function satisfying the target value out of the plurality of values of the evaluation function calculated in the fourth step.

2. The medium according to claim 1, wherein in the second step, from the plurality of evaluation items, an evaluation item whose value is smaller than the value of the evaluation item of interest for the parameter value is selected as the auxiliary evaluation item.

3. The medium according to claim 1, wherein in the second step, from the plurality of evaluation items, an evaluation item whose sensitivity to a change in the parameter value is higher than that of the evaluation item of interest is selected as the auxiliary evaluation item.

4. The medium according to claim 1, wherein in the second step, from the plurality of evaluation items, an evaluation item whose value continuously changes upon changing the parameter value is selected as the auxiliary evaluation item.

5. The medium according to claim 1, wherein in the second step, the evaluation item whose value changes in the same direction as that of the change in the value of the evaluation item of interest upon changing the parameter value included in the exposure condition is selected as the auxiliary evaluation item by referring to a table representing a correspondence relationship between the plurality of evaluation items.

6. The medium according to claim 1, wherein if none of the plurality of values of the evaluation function calculated in the fourth step satisfies the target value, an evaluation item different from the auxiliary evaluation item selected in the second step is selected as a new auxiliary evaluation item, and the program causes the computer to execute the third step, the fourth step, and the fifth step.

7. The medium according to claim 1, wherein if at least one of the plurality of values of the evaluation function calculated in the fourth step satisfies the target value,
the program causes the computer to execute:
a sixth step of setting a new evaluation function of only the evaluation item of interest;
a seventh step of calculating a value of the new evaluation function set in the sixth step for each of the plurality of images formed on the image plane of the projection optical system in correspondence with the parameter value while changing the parameter value of the exposure condition the defined number of times from the parameter values decided in the fifth step so as to make the value of the new evaluation function set in the sixth step closer to the target value; and
an eighth step of deciding the parameter value of the exposure condition corresponding to the value of the evaluation function satisfying the target value from the plurality of values of the evaluation function calculated in the seventh step.

8. The medium according to claim 1, wherein in the third step, the evaluation function is set such that a direction in which the value of the evaluation item of interest comes closer to a target value matches a direction in which the value of the auxiliary evaluation item comes closer to a target value.

9. The medium according to claim 1, wherein
the evaluation item of interest is a depth of focus on the image plane of the projection optical system, and
the auxiliary evaluation item includes at least one of a difference between a size of the target pattern and a size of an image of the pattern of the mask formed on the image plane of the projection optical system, and an exposure margin of the image of the pattern of the mask formed on the image plane of the projection optical system.

10. The medium according to claim 1, wherein the exposure condition includes at least one of a shape of the pattern of the mask and a light intensity distribution to be formed on a pupil plane of the illumination optical system.

11. A decision method of deciding an exposure condition in an exposure apparatus including an illumination optical system for illuminating a mask, and a projection optical system for projecting an image of a pattern of the mask onto a substrate, the method being executed by a computer, the method comprising:
a first step of selecting an evaluation item of interest that is an evaluation item from a plurality of evaluation items calculated from an image formed on an image plane of the projection optical system in correspondence with the exposure condition for evaluating the image in comparison with a target pattern to be formed on the substrate;
a second step of selecting an auxiliary evaluation item from the plurality of evaluation items which is different from the evaluation item of interest and changes a value in the same direction as that of a change in a value of the evaluation item of interest upon changing a parameter value of the exposure condition;
a third step of setting an evaluation function including the evaluation item of interest and the auxiliary evaluation item as values;
a fourth step of changing the parameter value of the exposure condition so as to make a value of the evaluation function closer to a target value and calculating the value of the evaluation function for each of a plurality of images formed on the image plane of the projection optical system in correspondence with the changed parameter value of the exposure condition; and
a fifth step of deciding the parameter value of the exposure condition corresponding to a value of the evaluation function satisfying the target value from the plurality of values of the evaluation function calculated in the fourth step.

12. A computer that executes a decision method according to claim 11.

13. A decision method of deciding an exposure condition in an exposure apparatus including an illumination optical system for illuminating a mask, and a projection optical system for projecting an image of a pattern of the mask onto a substrate, the method being executed by a computer, the method comprising:
a step of calculating values of an evaluation item using an image formed on an image plane of the projection optical system for evaluating the image in comparison with a target pattern to be formed on the substrate while changing a parameter value of the exposure condition, and deciding the parameter value of the exposure condition corresponding to a value of the evaluation item satisfying a target value,
wherein the evaluation item includes an evaluation item of interest and an auxiliary evaluation item which is different from the evaluation item of interest and changes a value in a case where a value of the evaluation item of interest does not change when the parameter values are changed.

14. A decision method of deciding an exposure condition in an exposure apparatus including an illumination optical system for illuminating a mask, and a projection optical system for projecting an image of a pattern of the mask onto a substrate, the method being executed by a computer, the method comprising:
a step of calculating values of an evaluation item using an image formed on an image plane of the projection optical system for evaluating the image in comparison with a target pattern to be formed on the substrate while changing a parameter value of the exposure condition, and deciding the parameter value of the exposure condition corresponding to a value of the evaluation item satisfying a target value,
wherein the evaluation item includes an evaluation item of interest and an auxiliary evaluation item which is different from the evaluation item of interest and takes an abnormal value when the image formed on the image plane of the projection optical system is abnormal.

15. A non-transitory computer-readable storage medium storing a program that causes a computer to execute a decision method according to claim 13.

16. A non-transitory computer-readable storage medium storing a program that causes a computer to execute a decision method according to claim 14.

17. A computer that executes a decision method according to claim 13.

18. A computer that executes a decision method according to claim 14.

* * * * *